US012648235B2

(12) United States Patent
Watakabe et al.

(10) Patent No.: US 12,648,235 B2
(45) Date of Patent: Jun. 2, 2026

(54) METHOD FOR MANUFACTURING SEMICONDUCTOR DEVICE

(71) Applicants: Japan Display Inc., Tokyo (JP); IDEMITSU KOSAN CO., LTD., Tokyo (JP)

(72) Inventors: Hajime Watakabe, Tokyo (JP); Masashi Tsubuku, Tokyo (JP); Toshinari Sasaki, Tokyo (JP); Takaya Tamaru, Tokyo (JP)

(73) Assignees: Japan Display Inc., Tokyo (JP); IDEMITSU KOSAN CO., LTD., Tokyo (JP)

( * ) Notice: Subject to any disclaimer, the term of this patent is extended or adjusted under 35 U.S.C. 154(b) by 343 days.

(21) Appl. No.: 18/474,389

(22) Filed: Sep. 26, 2023

(65) Prior Publication Data

US 2024/0105819 A1      Mar. 28, 2024

(30) Foreign Application Priority Data

Sep. 27, 2022    (JP) ................................. 2022-154209

(51) Int. Cl.
| | |
|---|---|
| *H10D 99/00* | (2025.01) |
| *H01L 21/02* | (2006.01) |
| *H10D 30/67* | (2025.01) |
| *H10P 14/20* | (2026.01) |

(52) U.S. Cl.
CPC ......... *H10D 99/00* (2025.01); *H10D 30/6755* (2025.01); *H10P 14/3802* (2026.01)

(58) Field of Classification Search
CPC ..... C23C 14/08; C23C 14/083; C23C 14/086; C23C 14/3407; C23C 14/3414; H10D 30/6756
See application file for complete search history.

(56) References Cited

U.S. PATENT DOCUMENTS

| | | |
|---|---|---|
| 2012/0064664 A1 | 3/2012 | Yamazaki et al. |
| 2014/0034946 A1 | 2/2014 | Yamazaki et al. |
| 2014/0077205 A1 | 3/2014 | Yamazaki et al. |
| 2014/0113405 A1 | 4/2014 | Tsubuku et al. |

(Continued)

FOREIGN PATENT DOCUMENTS

| | | | | |
|---|---|---|---|---|
| CN | 113490976 A | * | 10/2021 | ............. H10K 50/11 |
| CN | 107799668 B | * | 4/2022 | ............. H10D 99/00 |

(Continued)

*Primary Examiner* — Edward Chin
(74) *Attorney, Agent, or Firm* — Maier & Maier, PLLC

(57)    ABSTRACT

A method for manufacturing a semiconductor device includes depositing a first metal oxide film with aluminum as a major component on a substrate, depositing an amorphous oxide semiconductor film on the first metal oxide film under an oxygen partial pressure of 3% to 5%, processing the oxide semiconductor film into a patterned oxide semiconductor layer, crystallizing the oxide semiconductor layer by performing a first heat treatment on the patterned oxide semiconductor layer, processing the first metal oxide film using the crystallized oxide semiconductor layer as a mask, depositing a gate insulating film on the oxide semiconductor layer, and forming a gate electrode on the gate insulating film, wherein a thickness of the oxide semiconductor film is more than 10 nm and 30 nm or less.

6 Claims, 29 Drawing Sheets

(56)     References Cited

U.S. PATENT DOCUMENTS

| 2015/0084043 | A1 |   | 3/2015 | Ishihara et al. |
| 2017/0236844 | A1 |   | 8/2017 | Yamazaki et al. |
| 2023/0027596 | A1 | * | 1/2023 | Yamaguchi ....... H01L 21/02554 |

FOREIGN PATENT DOCUMENTS

| CN | 109311756 | B | * | 7/2022 | ....... H10D 30/67555 |
| JP | 2014-099601 | A |   | 5/2014 | |
| JP | 2016-184771 | A |   | 10/2016 | |
| JP | 2018-006730 | A |   | 1/2018 | |
| JP | 2021-108405 | A |   | 7/2021 | |
| JP | 2021-141338 | A |   | 9/2021 | |
| JP | 2021-153196 | A |   | 9/2021 | |
| WO | WO-2017217529 | A1 | * | 12/2017 | ......... C23C 14/3414 |

* cited by examiner

METHOD FOR MANUFACTURING SEMICONDUCTOR DEVICE

CROSS-REFERENCE TO RELATED APPLICATIONS

This application claims the benefit of priority to Japanese Patent Application No. 2022-154209, filed on Sep. 27, 2022, the entire contents of which are incorporated herein by reference.

FIELD

An embodiment of the present invention relates to a semiconductor device and a manufacturing method of the semiconductor device. In particular, an embodiment of the present invention relates to a semiconductor device in which an oxide semiconductor is used as a channel and a manufacturing method of the semiconductor device.

BACKGROUND

In recent years, a semiconductor device in which an oxide semiconductor is used as a channel instead of amorphous silicon, low-temperature polysilicon and single-crystal silicon, has been developed (for example, Japanese laid-open patent publication No. 2021-141338, Japanese laid-open patent publication No. 2014-099601, Japanese laid-open patent publication No. 2021-153196, Japanese laid-open patent publication No. 2018-006730, Japanese laid-open patent publication No. 2016-184771, and Japanese laid-open patent publication No. 2021-108405). The semiconductor device in which an oxide semiconductor is used as a channel can be formed in a simple structure and low-temperature process, similar to a semiconductor device in which amorphous silicon is used as a channel. The semiconductor device in which an oxide semiconductor is used as a channel is known to have higher mobility than the semiconductor device in which amorphous silicon is used as a channel.

SUMMARY

A method for manufacturing a semiconductor device according to an embodiment of the present invention includes depositing a first metal oxide film with aluminum as a major component on a substrate, depositing an amorphous oxide semiconductor film on the first metal oxide film under an oxygen partial pressure of 3% to 5%, processing the oxide semiconductor film into a patterned an oxide semiconductor layer, crystallizing the oxide semiconductor layer by performing a first heat treatment on the patterned oxide semiconductor layer, processing the first metal oxide film using the crystallized oxide semiconductor layer as a mask, depositing a gate insulating film on the oxide semiconductor layer, and forming a gate electrode on the gate insulating film, wherein a thickness of the oxide semiconductor film is more than 10 nm and 30 nm or less.

BRIEF DESCRIPTION OF DRAWINGS

FIG. 24 is a plurality of photographs of a surface of each of a plurality of semiconductor devices.

DESCRIPTION OF EMBODIMENTS

Figure 1:
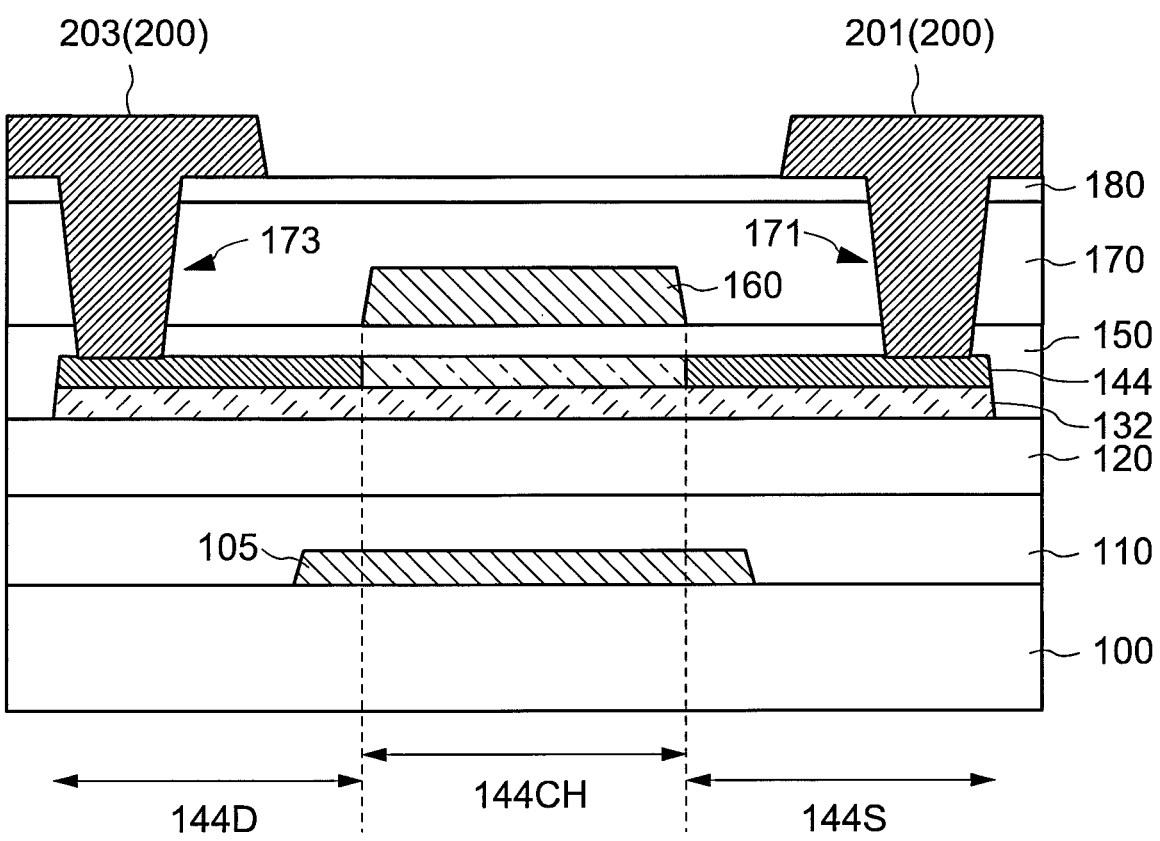
FIG. 1 is a cross-sectional view showing an outline of a semiconductor device according to an embodiment of the present invention.

The field-effect mobility of conventional thin-film transistors containing oxide semiconductor layers is not that large, even when oxide semiconductor layers with crystalline properties are used. Therefore, it is desired to improve the field-effect mobility of thin-film transistors by improving the crystal structure of oxide semiconductor layers used in thin-film transistors.

It is known that semiconductor devices with high mobility can be obtained by increasing the ratio of indium in the oxide semiconductor layer so that it is relatively high, but oxygen defects are easily formed in the oxide semiconductor layer. If many oxygen defects exist in the channel formed in the oxide semiconductor layer, they can cause fluctuations in the electrical characteristics of the semiconductor device.

One of the purposes according to an embodiment of the present invention is to provide semiconductor devices with high reliability and mobility.

Hereinafter, embodiments of the present invention will be described with reference to the drawings. The following invention is merely an example. A structure that can be easily conceived of by a person skilled in the art by appropriately changing the structure of the embodiment while keeping the gist of the invention is naturally included in the scope of the present invention. For clarity of explanation, the drawings may be schematically represented with respect to widths, thicknesses, shapes, and the like of each portion as compared with actual embodiments. However, the illustrated shapes are merely examples, and do not limit the interpretation of the present invention. In the present specification and the drawings, the same reference signs are given to the same components as those described previously with respect to the above-described drawings, and a detailed description thereof may be omitted as appropriate.

"Semiconductor device" refers to any device that can function by utilizing semiconductor properties. A transistor and a semiconductor circuit are one form of a semiconductor device. For example, the semiconductor device shown below may be an integrated circuit (Integrated Circuit: IC) such as a display device or a micro-processing unit (Micro-Processing Unit: MPU), or a transistor used in a memory circuit.

"Display device" refers to a structure that displays an image using an electro-optic layer. For example, the term display device may refer to a display panel including the electro-optic layer, or may refer to a structure with other optical members (for example, a polarized member, a backlight, a touch panel, and the like) attached to a display cell. "Electro-optic layer" may include a liquid crystal layer, an electroluminescent (EL) layer, an electrochromic (EC) layer, and an electrophoretic layer, unless there is a technical inconsistency. Therefore, although embodiments will be described by exemplifying a liquid display device including a liquid crystal layer and an organic EL display device including an organic EL layer as the display device, the structure in the present embodiment can be applied to a display device including the other electro-optic layers described above.

In each embodiment of the present invention, a direction from a substrate toward an oxide semiconductor layer is referred to as on or above. Conversely, a direction from the oxide semiconductor layer to the substrate is referred to as lower or below. In this way, for convenience of explanation, although the phrase "on" or "under" is used to describe, for example, the upper and lower relationship between the substrate and the oxide semiconductor layer, they may be arranged differently from the drawings. In the following explanation, for example, the expression "oxide semiconductor layer on a substrate" merely describes the upper and lower relationship between the substrate and the oxide semiconductor layer as described above, and another member may be arranged between the substrate and the oxide semiconductor layer. The terms "upper" or "lower" means a stacking order in a structure in which a plurality of layers is stacked, and may be a positional relationship in which the transistor and a pixel electrode do not overlap each other in a plan view when expressed as a pixel electrode above a transistor. On the other hand, when expressed as a pixel electrode vertically above a transistor, it means a positional relationship in which the transistor and the pixel electrode overlap each other in a plan view.

In this disclosure, the terms "film" and "layer" may be interchangeable with each other as the case may be.

In the present specification, expressions "α includes A, B, or C," "α includes any of A, B, and C," "α includes one selected from a group consisting of A, B, and C," and the like do not exclude the case where a includes a plurality of combinations of A to C unless otherwise indicated. Furthermore, these expressions do not exclude the case where a includes other elements.

In addition, the following embodiments can be combined with each other as long as there is no technical inconsistency.

First Embodiment

A semiconductor device 10 according to an embodiment of the present invention will be described with reference to FIG. 1 to FIG. 14.

Structure of Semiconductor Device

Figure 2:
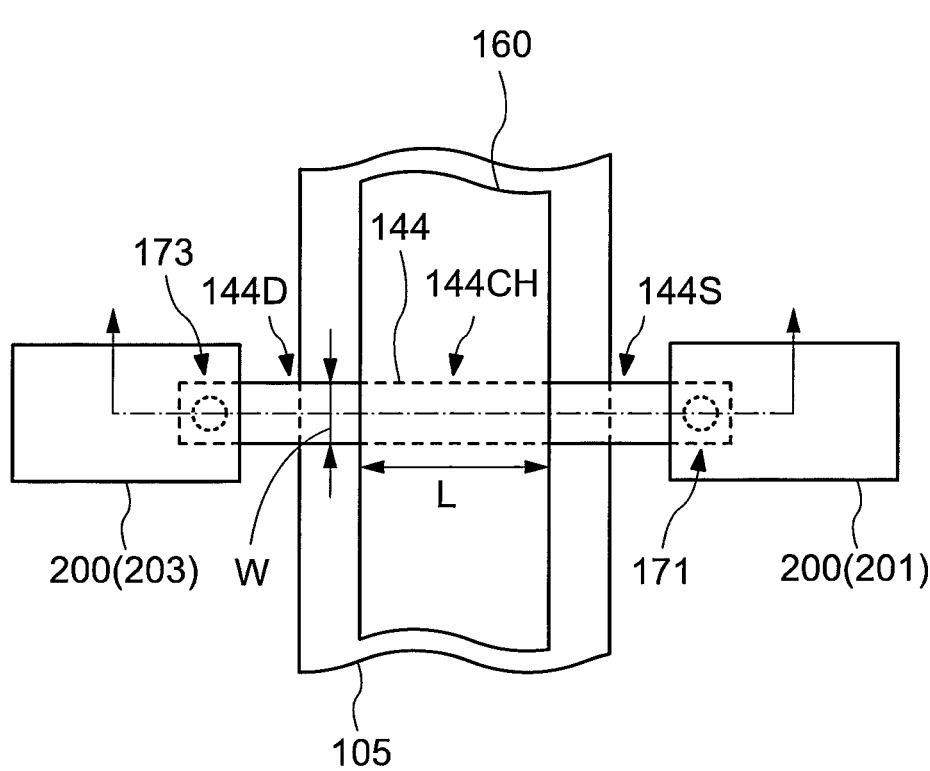
FIG. 2 is a plan view showing an outline of a semiconductor device according to an embodiment of the present invention.
Figure 2:
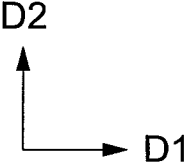

The structure of the semiconductor device 10 according to an embodiment of the present invention will be described with reference to FIG. 1 and FIG. 2. FIG. 1 is a cross-sectional view showing an outline of a semiconductor device according to an embodiment of the present invention. FIG. 2 is a plan view showing an outline of a semiconductor device according to an embodiment of the present invention. In addition, a cross section taken along a dashed-dotted line shown in FIG. 2 corresponds to a cross-sectional view shown in FIG. 1.

As shown in FIG. 1, the semiconductor device 10 is arranged above a substrate 100. The semiconductor device 10 includes a gate electrode 105, gate insulating films 110 and 120, an oxide semiconductor layer 144, a gate insulating film 150, a gate electrode 160, insulating films 170 and 180, a source electrode 201, and a drain electrode 203. When the source electrode 201 and the drain electrode 203 are not particularly distinguished from each other, they may be collectively referred to as a source electrode and a drain electrode 200. In addition, the oxide semiconductor layer 144, the gate insulating film 150, and the gate electrode 160 may be referred to as a transistor.

The gate electrode 105 is arranged on the substrate 100. The gate insulating film 110 and the gate insulating film 120 are provided on a top of the substrate 100 and the gate electrode 105. The metal oxide layer 132 is arranged on the gate insulating film 120. The metal oxide layer 132 is in contact with the gate insulating film 120. The oxide semiconductor layer 144 is arranged on the metal oxide layer 132. The oxide semiconductor layer 144 is in contact with the metal oxide. Among the main surfaces of the oxide semiconductor layer 144, a surface in contact with the metal oxide layer 132 is referred to as a lower surface. An edge of the metal oxide layer 132 and an edge of the oxide semiconductor layer 144 are substantially coincident.

The oxide semiconductor layer 144 has light transmittance. The oxide semiconductor layer 144 is divided into a source area 144S, a drain area 144D, and a channel area 144CH. The channel area 144CH is an area of the oxide semiconductor layer 144 vertically below the gate electrode 160. The source area 144S is an area of the oxide semiconductor layer 144 that does not overlap the gate electrode 160 and is closer to the source electrode 201 than the channel area 144CH. The drain area 144D is an area of the oxide semiconductor layer 144 that does not overlap the gate electrode 160 and is closer to the drain electrode 203 than the channel area 144CH.

The oxide semiconductor layer 144 has a polycrystalline structure including multiple crystal grains. Although the details are described later, the oxide semiconductor layer 144 having a polycrystalline structure can be formed by using a Poly-OS (Poly-crystalline Oxide Semiconductor) technology. Although the structure of the oxide semiconductor layer 144 is described below, an oxide semiconductor having a polycrystalline structure may be referred to as a Poly-OS.

The crystal grain size of the crystal grain included in the Poly-OS observed from the top surface of the oxide semiconductor layer 144 (or from the thickness direction of the oxide semiconductor layer 144) or from the cross section of the oxide semiconductor layer 144 is greater than or equal to 0.1 µm, preferably greater than or equal to 0.3 µm, and more preferably greater than or equal to 0.5 µm. The crystal grain size of the crystal grain can be obtained by, for example, a cross-sectional SEM observation, a cross-sectional TEM observation, or an electron back scattered diffraction (EBSD) method.

A thickness of the oxide semiconductor layer 144 is greater than 10 nm and less than 30 nm. As described above, since the crystal grain included in the Poly-OS has a crystal grain size greater than or equal to 0.1 µm, the oxide semiconductor layer 144 includes a region including only one crystal grain in the thickness direction.

An oxide semiconductor containing two or more metal elements including indium (In) is used for the oxide semiconductor layer 144. In the oxide semiconductor layer 144, the atomic ratio of indium to the two or more metal elements is greater than or equal to 50%. Gallium (Ga), zinc (Zn), aluminum (Al), hafnium (Hf), yttrium (Y), zirconium (Zr), and lanthanoids are used as the metal elements other than indium. The oxide semiconductor layer 144 may contain a metal element other than the above metal elements. In the present embodiment, the oxide semiconductor layer 144 is preferably an IGO-based oxide semiconductor. An IGO-based oxide semiconductor is an oxide semiconductor containing indium, gallium, and oxygen.

In addition, the source area 144S and the drain area 144D contain an impurity element. Further, the source area 144S and the drain area 144D in the oxide semiconductor layer 144 have a lower resistivity as compared with the channel area 144CH due to the addition of the impurity element. That is, the source area 144S and the drain area 144D have physical properties as a conductor.

The concentrations of the impurity element contained in the source area 144S and the drain area 144D are preferably $1 \times 10^{18}$ cm$^{-3}$ or more and $1 \times 10^{21}$ cm$^{-3}$ or less when measured by SIMS spectrometry (secondary ion-mass spectrometry). In this case, the impurity element means argon (Ar), phosphorus (P), or boron (B). In addition, in the case where the concentrations of the impurity element contained in the source area 144S and the drain area 144D are $1 \times 10^{18}$ cm$^{-3}$ or more and $1 \times 10^{21}$ cm$^{-3}$ or less, it is presumed that the impurity element was intentionally added by an ion-implantation method or a doping method. However, the source area 144S and the drain area 144D may contain an impurity element other than argon (Ar), phosphorus (P), or boron (B) at a concentration less than $1 \times 10^{18}$ cm$^{-3}$.

The gate electrode 160 faces the oxide semiconductor layer 144. The gate insulating film 150 is arranged between the oxide semiconductor layer 144 and the gate electrode 160. The gate insulating film 150 is in contact with the oxide semiconductor layer 144. A surface of the main surface of the oxide semiconductor layer 144, which is in contact with the gate insulating film 150, is referred to as an upper surface. A surface between the upper and lower surfaces is referred to as a side surface. The insulating films 170 and 180 are arranged on the gate insulating film 150 and the gate electrode 160. Openings 171 and 173 that reach the oxide semiconductor layer 144 are arranged in the insulating films 170 and 180. The source electrode 201 is arranged inside the opening 171. The source electrode 201 is in contact with the oxide semiconductor layer 144 at the bottom of the opening 171. The drain electrode 203 is arranged inside the opening 173. The drain electrode 203 is in contact with the oxide semiconductor layer 144 at the bottom of the opening 173.

The gate electrode 160 has a function as a top-gate of the semiconductor device 10 and a light-shielding film for the oxide semiconductor layer 144. The gate insulating film 150 has a function as a gate insulating film for the top-gate, and has a function of releasing oxygen by a heat treatment in a manufacturing process. The insulating films 170 and 180 insulate the gate electrode 160 and the source-drain electrode 200 and have a function of reducing parasitic capacitance therebetween. Operations of the semiconductor device 10 are controlled mainly by a voltage supplied to the gate electrode 160. An auxiliary voltage is supplied to the gate electrode 105. However, in the case of using the gate electrode 105 simply as a light-shielding film, a specific voltage is not supplied to the gate electrode 105, and the gate electrode 105 may be in a floating state. That is, the gate electrode 105 may simply be referred to as a "light-shielding film."

As shown in FIG. 2, in a plan view, a planar pattern of the metal oxide layer 132 is substantially the same as a planar pattern of the oxide semiconductor layer 144. Referring to FIG. 1 and FIG. 2, the lower surface of the oxide semiconductor layer 144 is covered with the metal oxide layer 132. In particular, in the present embodiment, all of the lower surface of the oxide semiconductor layer 144 is covered with the metal oxide layer 132. In a direction D1, a width of the gate electrode 105 is greater than a width of the gate electrode 160. The direction D1 is a direction connecting the source electrode 201 and the drain electrode 203, and is a direction indicating a channel length L of the semiconductor device 10. Specifically, a length in the direction D1 in the area (the channel area CH) where the oxide semiconductor layer 144 and the gate electrode 160 overlap is the channel length L, and a width in a direction D2 in the channel area CH is a channel width W.

In the present embodiment, although a structure in which all of the lower surface of the oxide semiconductor layer 144 is covered with the metal oxide layer 132 is exemplified, the present invention is not limited to this structure. For example, a part of the lower surface of the oxide semiconductor layer 144 may not be in contact with the metal oxide layer 132. For example, all of the lower surface of the oxide semiconductor layer 144 in the channel area 144CH may be covered with the metal oxide layer 132, and all or part of the lower surface of the oxide semiconductor layer 144 in the source area 144S and the drain area 144D may not be covered with the metal oxide layer 132. That is, all or part of the lower surface of the oxide semiconductor layer 144 in the source area 144S and the drain area 144D may not be in contact with the metal oxide layer 132. However, in the above structure, a part of the lower surface of the oxide semiconductor layer 144 in the channel area 144CH may not be covered with the metal oxide layer 132, and the other part of the lower surface may be in contact with the metal oxide layer 132.

In FIG. 2, although a structure in which the source-drain electrode 200 does not overlap the gate electrode 105 and the gate electrode 160 in a plan view is exemplified, the structure is not limited to this structure. For example, in a plan view, the source-drain electrode 200 may overlap at least one of the gate electrode 105 or the gate electrode 160. The above structure is merely an embodiment, and the present invention is not limited to the above structure.

In the present embodiment, although a structure using a dual-gate transistor in which the gate electrode is arranged both above and below the oxide semiconductor layer as the semiconductor device 10 is exemplified, the structure is not limited to this structure. For example, a bottom-gate transistor in which the gate electrode is arranged only below the oxide semiconductor layer or a top-gate transistor in which the gate electrode is arranged only above the oxide semiconductor layer may be used as the semiconductor device 10. The above structure is merely an embodiment, and the present invention is not limited to the above structure.

Manufacturing Method of Semiconductor Device

Figure 3:
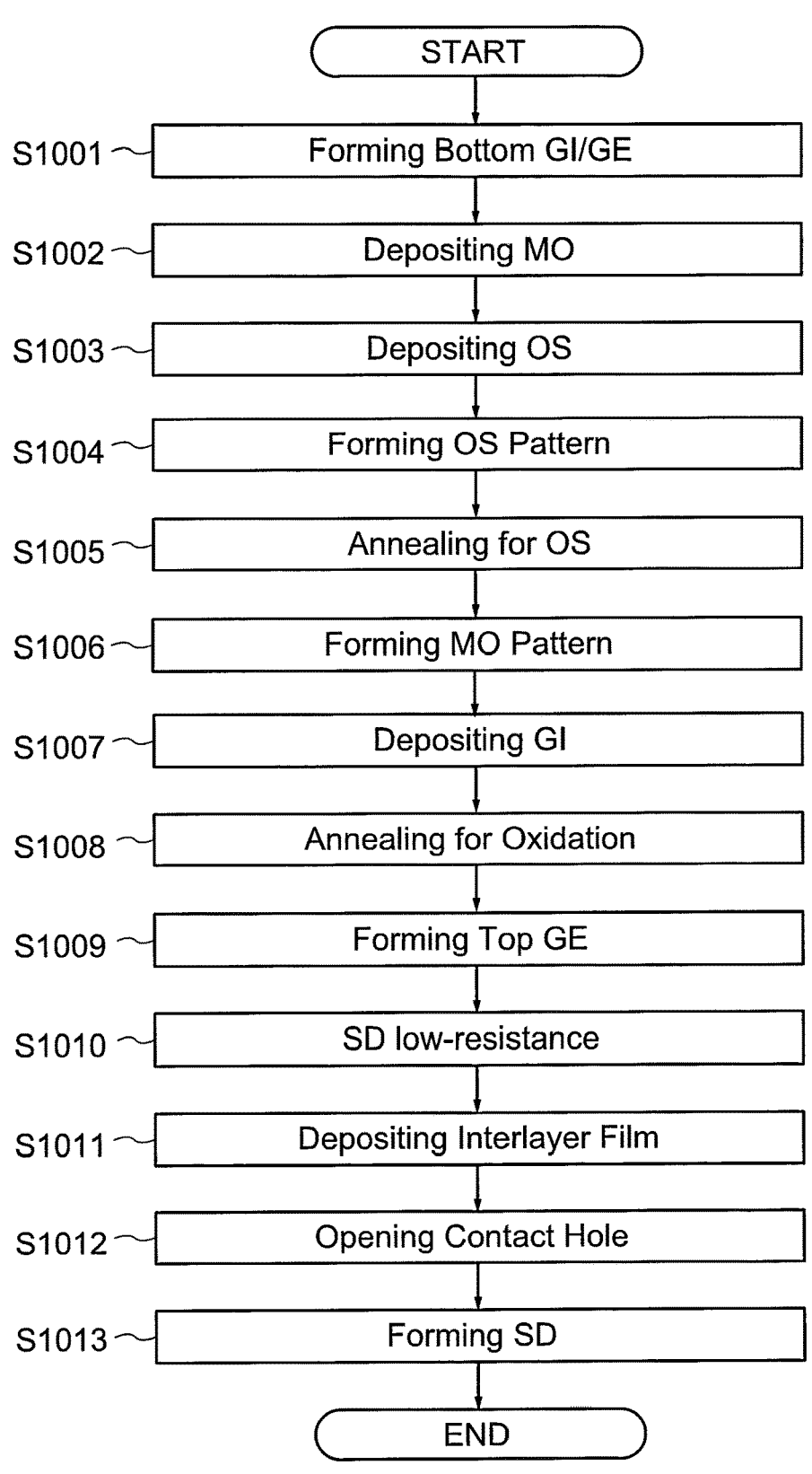
FIG. 3 is a sequence diagram showing a manufacturing method of a semiconductor device according to an embodiment of the present invention.

With reference to FIG. 3 to FIG. 14, a manufacturing method of a semiconductor device according to an embodiment of the present invention will be described. FIG. 3 is a sequence diagram showing a manufacturing method of a semiconductor device according to an embodiment of the present invention. FIG. 4 to FIG. 14 are cross-sectional views showing a manufacturing method of a semiconductor device according to an embodiment of the present invention.

Figure 4:
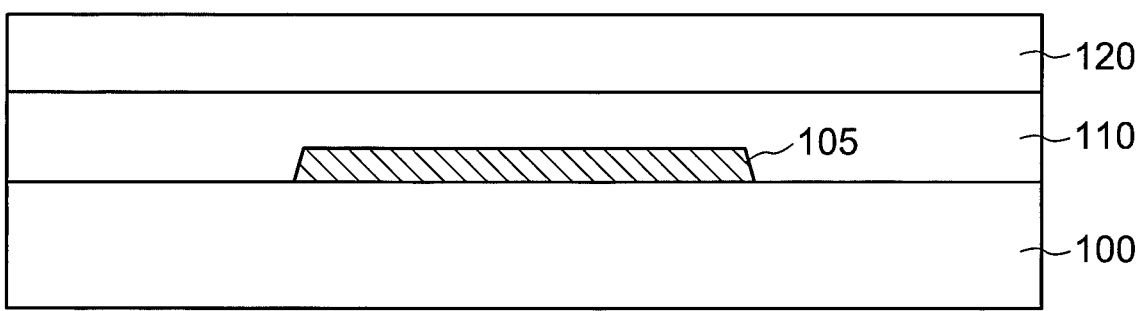
FIG. 4 is a cross-sectional view showing a manufacturing method of a semiconductor device according to an embodiment of the present invention.

As shown in FIG. 3 and FIG. 4, the gate electrode as the bottom gate is formed on the substrate 100, and the gate insulating film 110 and 120 are formed on the gate electrode ("Forming Bottom GI/GE" of step S1001 shown in FIG. 3).

A rigid substrate with light transmittance such as a glass substrate, a quartz substrate, a sapphire substrate, or the like is used as the substrate 100. When the substrate 100 needs to be flexible, a polyimide substrate, an acryl substrate, a siloxane substrate, a fluororesin substrate, or a substrate containing resin is used as the substrate 100. In the case where the substrate containing resin is used as the substrate 100, an impurity element may be introduced into the resin in order to improve the heat resistance of the substrate 100. In particular, in the case where the semiconductor device 10 is a top-emission display, since the substrate 100 does not need to be transparent, impurities that deteriorate the translucency of the substrate 100 may be used. In the case where the semiconductor device 10 is used for an integrated circuit that is not a display device, a substrate without translucency such as a semiconductor substrate such as a silicon substrate, a silicon carbide substrate, a compound semiconductor substrate, or a conductive substrate such as a stainless substrate is used as the substrate 100.

The gate electrode 105 is formed by processing a conductive film deposited by the sputtering method. Common metal materials are used for the gate electrode 105. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys thereof or compounds thereof are used as these members. The above-described materials may be used in a single layer or in a stacked layer as the gate electrode 105.

The gate insulating films 110 and 120 are deposited by a CVD (Chemical Vapor Deposition) method or a sputtering method. A general insulating material is used as the gate insulating films 110 and 120. For example, an inorganic insulating material such as silicon oxide ($SiO_x$), silicon oxynitride ($SiO_xN_y$), silicon nitride ($SiN_x$), silicon nitride oxide ($SiN_xO_y$) is used as the gate insulating films 110 and 120. The above $SiO_xN_y$ is a silicon compound containing nitrogen (N) in a ratio (x>y) smaller than oxygen (O). $SiN_xO_y$ is a silicon compound containing oxygen in a ratio (x>y) smaller than nitrogen.

It is preferable that an insulating material containing nitrogen and an insulating material containing oxygen are formed in this order from the substrate 100 as the gate insulating films 110 and 120. For example, impurities that diffuse from the substrate 100 toward the oxide semiconductor layer 144 can be blocked by using a nitrogen-containing insulating material as the gate insulating film 110. In addition, oxygen can be released by a heat treatment by using an insulating material containing oxygen as the gate insulating film 120. For example, the temperature of the heat treatment in which the insulating material containing oxygen releases oxygen is 600° C. or less, 500° C. or less, 450° C. or less, or 400° C. or less. That is, for example, the insulating material containing oxygen releases oxygen at the heat treatment temperature performed in the manufacturing process of the semiconductor device 10 when a glass substrate is used as the substrate 100. In the present embodiment, for example, silicon nitride is formed as the gate insulating film 110. For example, silicon oxide is formed as the gate insulating film 120.

Figure 5:
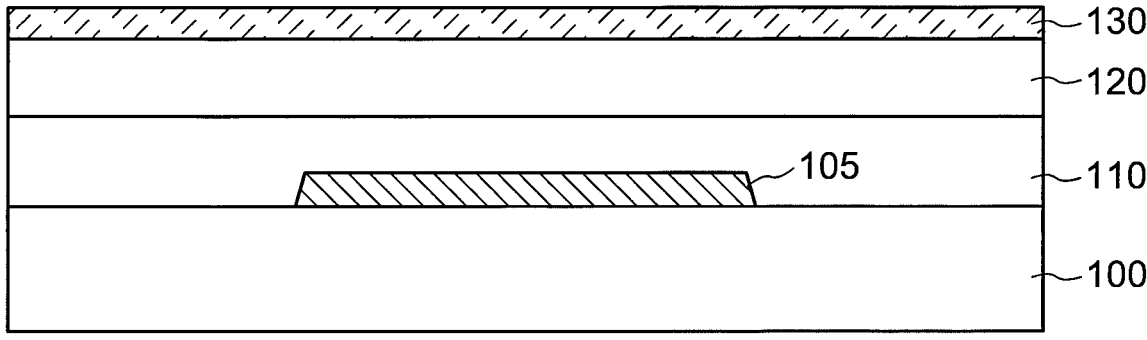
FIG. 5 is a cross-sectional view showing a manufacturing method of a semiconductor device according to an embodiment of the present invention.

As shown in FIG. 3 and FIG. 5, a metal oxide film 130 is deposited on the gate insulating film 120 ("Depositing MO" in step S1002 shown in FIG. 3). The metal oxide film 130 is deposited by sputtering or atomic layer deposition (ALD).

An aluminum-based metal oxide is used as the metal oxide film 130. For example, an inorganic insulating film such as aluminum oxide ($AlO_x$), aluminum oxynitride ($AlO_xN_y$), aluminum nitride oxide ($AlN_xO_y$), and aluminum nitride ($AlN_x$) are used as the metal oxide film 130. The "metal oxide layer containing aluminum as a main component" means that the proportion of aluminum contained in the metal oxide film 130 is 1% or more of the total amount of the metal oxide film 130. The proportion of aluminum contained in the metal oxide film 130 may be 5% or more and 70% or less, 10% or more and 60% or less, or 30% or more and 50% or less of the entire metal oxide film 130. The ratios may be mass ratios or weight ratios.

For example, a thickness of the metal oxide layer 130 is 1 nm or more and 50 nm or less, 1 nm or more and 30 nm or less, 1 nm or more and 20 nm or less, or 1 nm or more and 10 nm or less. In the present embodiment, aluminum oxide is used as the metal oxide layer 130. Aluminum oxide has high barrier properties against gases such as oxygen or hydrogen. In other words, barrier property refers to the ability to inhibit gases such as oxygen or hydrogen from permeating into aluminum oxide. This means that even if gases such as oxygen or hydrogen are present from the layer provided under the aluminum oxide film, they are not allowed to migrate to the layer provided above the aluminum oxide film. Alternatively, this means that even if gases such as oxygen or hydrogen are present from the layer provided above the aluminum oxide film, they are not transferred to the layer provided below the aluminum oxide film. In the present embodiment, the aluminum oxide used as the metal oxide film 130 blocks the hydrogen and oxygen released from the gate insulating film 120 and prevents the released hydrogen and oxygen from reaching the oxide semiconductor layer.

Figure 6:
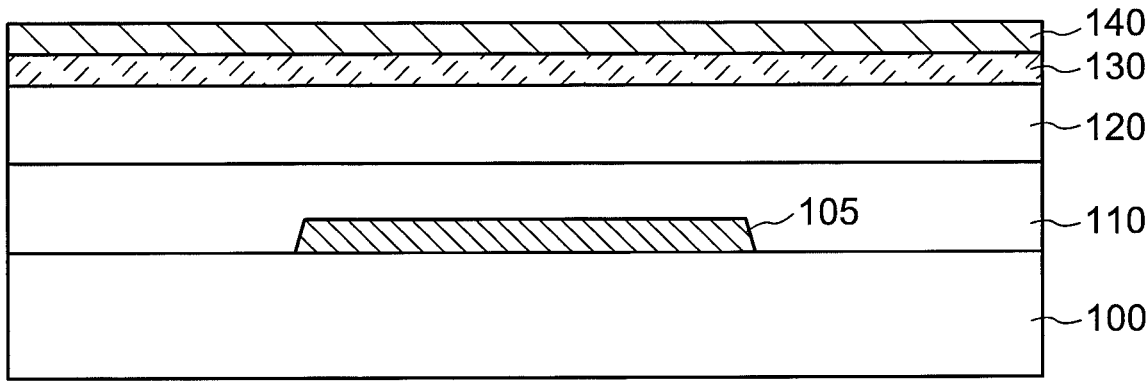
FIG. 6 is a cross-sectional view showing a manufacturing method of a semiconductor device according to an embodiment of the present invention.

As shown in FIG. 3 and FIG. 6, an oxide semiconductor film 140 is deposited on a top of the metal oxide film 130 (step S1003 "Depositing OS" shown in FIG. 3). This process may be referred to as forming the oxide semiconductor film 140 on the substrate 100.

The oxide semiconductor film 140 is deposited by a sputtering method or an atomic layer deposition (ALD: Atomic Layer Deposition) method. For example, a thickness of the oxide semiconductor film 140 is more than 10 nm and 30 nm or less.

A metal oxide having semiconductor properties can be used as the oxide semiconductor film 140. For example, an oxide semiconductor containing two or more metals including indium (In) is used as the oxide semiconductor film 140. The proportion of indium in the two or more metals is 50% or more. Gallium (Ga), zinc (Zn), aluminum (Al), hafnium (Hf), yttrium (Y), zirconia (Zr), and lanthanoids are used as the oxide semiconductor film 140 in addition to indium. Elements other than those described above may be used as the oxide semiconductor film 140. In the present embodiment, an IGO-based oxide semiconductor is preferred.

In the case where the oxide semiconductor film 140 is crystallized by OS annealing described later, the oxide semiconductor film 140 after the film deposition and before the OS annealing is preferably amorphous (the oxide semiconductor has few crystal components). In other words, in a film-deposition method of the oxide semiconductor film 140, the conditions immediately after the oxide semiconductor film 140 is deposited are preferred to be such that the oxide semiconductor film 140 is not crystallized as much as possible. For example, in the case where the oxide semiconductor film 140 is deposited by the sputtering method, the oxide semiconductor film 140 is deposited while controlling the temperature of objects to be film-formed (the substrate 100 and the structure formed thereon).

When the film formation is performed on the object to be film-formed by the sputtering method, ions generated in the plasma and atoms recoiled by a sputtering target collide with the object to be film-formed, so that the temperature of the object to be film-formed rises with the film-forming process. When the temperature of the object to be film-formed during the film-forming process rises, microcrystals are contained in the oxide semiconductor layer 144 immediately after the film-forming process. If the oxide semiconductor film 140 contains microcrystals, subsequent OS annealing cannot increase the grain size. For example, in order to control the temperature of the object to be film-formed as described above, film formation can be performed while cooling the object to be film-formed. For example, the object to be film-formed can be cooled from a surface opposite to a film-forming surface so that the temperature of the film-forming surface of the object to be film-formed (hereinafter, referred to as "film-forming temperature") is 100° C. or less, 70° C. or less, 50° C. or less, or 30° C. or less. In particular, the deposition temperature of the oxide semiconductor film 140 in the present embodiment should be 50° C. or lower. As described above, forming the oxide semiconductor layer 144 while cooling the object to be film-formed makes it possible to form the oxide semiconductor layer 144 with few crystal components immediately after the film formation. In the present embodiment, the oxide semiconductor film 140 is formed at a deposition temperature of 50° C. or lower, and the OS annealing described below is performed at a heating temperature of 400° C. or more. Thus, in the present embodiment, the difference between the temperature at which the oxide semiconductor film 140 is formed and the temperature at which OS annealing is performed on the oxide semiconductor film 140 should be 350° C. or more.

In the sputtering process, the amorphous oxide semiconductor film 140 is deposited under conditions of an oxygen partial pressure of 10% or less. When the oxygen partial pressure is high, microcrystals are included in the oxide semiconductor film 140 immediately after deposition due to excess oxygen in the oxide semiconductor film 140. Therefore, it is preferable that the oxide semiconductor film 140 be deposited under conditions of low oxygen partial pressure. For example, the oxygen partial pressure is between 3% and 5%, preferably between 3% and 4%. If the oxide semiconductor film is deposited under conditions where the oxygen partial pressure is 2%, the oxide semiconductor film will not crystallize even if an OS annealing treatment is performed later.

Figure 7:
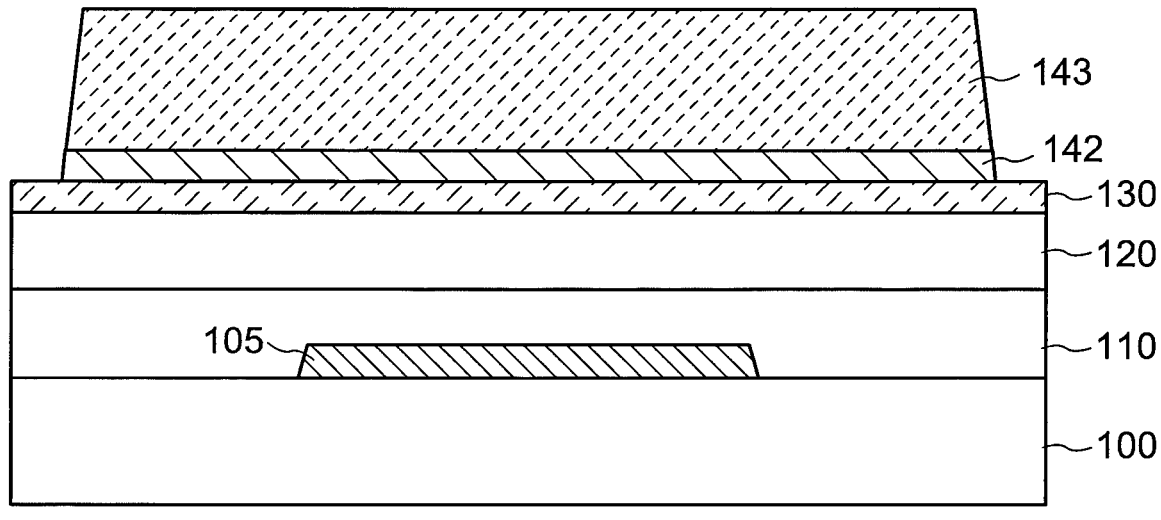
FIG. 7 is a cross-sectional view showing a manufacturing method of a semiconductor device according to an embodiment of the present invention.

As shown in FIG. 3 and FIG. 7, a pattern of the oxide semiconductor layer 142 is formed ("Forming OS Pattern" in step S1004 shown in FIG. 3). Although not shown, a resist mask 143 is formed on the oxide semiconductor film 140, and the oxide semiconductor film 140 is etched using the resist mask. Wet etching may be used, or dry etching may be used as the etching of the oxide semiconductor film 140. In the wet etching, the etching can be performed using an acidic etchant. For example, oxalic acid or hydrofluoric acid can be used as the etchant. This allows a patterned oxide semiconductor layer 142 to be formed. The resist mask 143 is then removed.

A pattern is preferably formed on the oxide semiconductor film 140 before the OS annealing. If the oxide semiconductor film 140 is crystallized by the OS annealing, it tends to be difficult to etch. In addition, even if the oxide semiconductor layer 142 is damaged by etching, the damage can be repaired by the OS annealing, which is preferable.

Figure 8:
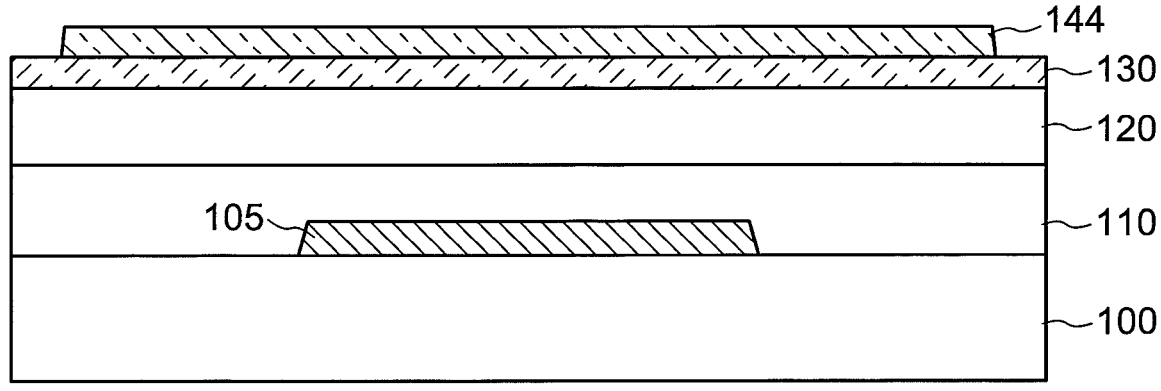
FIG. 8 is a cross-sectional view showing a manufacturing method of a semiconductor device according to an embodiment of the present invention.

As shown in FIG. 3 and FIG. 8, after the pattern formation of the oxide semiconductor layer 142, a heat treatment (OS annealing) is performed on the oxide semiconductor layer 142 ("Annealing for OS" in step S1005 shown in FIG. 3). In the OS annealing process, the oxide semiconductor layer 142 is held at a predetermined reaching temperature for a predetermined time. The predetermined reaching temperature is 300° C. or more and 500° C. or less, preferably 350° C. or more and 450° C. or less. In addition, the holding time at the reaching temperature is 15 minutes or more and 120 minutes or less, preferably 30 minutes or more and 60 minutes or less. Performing OS annealing crystallizes the oxide semiconductor layer 142, and the oxide semiconductor layer 144 having a polycrystalline structure is formed.

In thin-film transistors, reducing the thickness of the oxide semiconductor layer tends to increase the field-effect mobility by increasing the number of carriers in the vicinity of the interface with the gate insulator film and reducing the back-channel effect. In other words, in thin-film transistors, the smaller the thickness of the region functioning as a channel in the oxide semiconductor layer, the higher the field-effect mobility tends to be. Therefore, the smaller the thickness of the oxide semiconductor layer, the better. However, even if the oxide semiconductor layer is deposited with a thickness of 10 nm or less and then heat treated, the oxide semiconductor layer does not crystallize sufficiently. If the oxide semiconductor layer does not crystallize sufficiently, the oxide semiconductor layer and metal oxide film will be lost during the etching process for patterning the metal oxide film later using the oxide semiconductor layer as a mask.

In thin-film transistors, the crystallinity of the oxide semiconductor layer 144 contributes to the improvement of the field-effect mobility. Therefore, it is preferable that the oxide semiconductor layer 144 has a polycrystalline structure. However, if microcrystals are included in the oxide semiconductor film 140 at the time of deposition, the crystal grain size of the crystal grains in the polycrystalline structure cannot be increased by a subsequent heat treatment. Thus, it is difficult to achieve both thinning of the oxide semiconductor layer and good crystallization.

Furthermore, in the oxide semiconductor layer 144, if a large number of oxygen defects or hydrogen exists near the interface with the metal oxide layer 132, the interface level density increases. The trapping of electrons in the interface level causes the transistor to degrade through reliability testing, which is a factor that reduces the reliability of the semiconductor device.

According to the manufacturing method a semiconductor device according to an embodiment of the present invention, when the oxide semiconductor film 140 is deposited by the sputtering method, the film is deposited at a low oxygen partial pressure of 3% to 5%. By depositing the oxide semiconductor film 140 under conditions of low oxygen partial pressure, excess oxygen in the oxide semiconductor film 140 can be suppressed, and microcrystals can be suppressed in the oxide semiconductor film 140 immediately after deposition. As a result, the growth of crystals from microcrystals can be suppressed during the heat treatment of the oxide semiconductor layer 142. Therefore, even when the oxide semiconductor film 140 is deposited with a thin film thickness greater than 10 nm and less than 30 nm, the crystal grain size of the crystal grains of the polycrystalline structure of the oxide semiconductor layer 144 can be increased.

Figure 9:
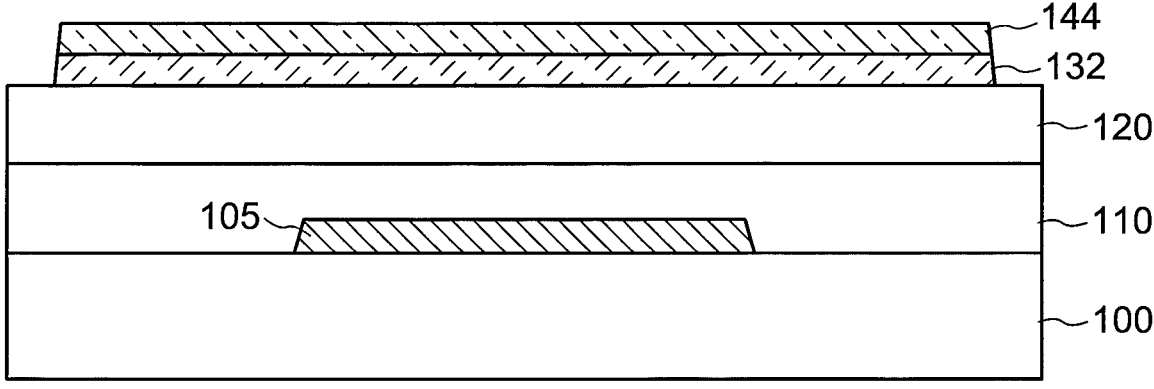
FIG. 9 is a cross-sectional view showing a manufacturing method of a semiconductor device according to an embodiment of the present invention.

As shown in FIG. 3 and FIG. 9, the metal oxide film 130 is patterned to form a metal oxide layer 132 ("Depositing MO Pattern" in step S1006 of FIG. 3). The oxide semiconductor layer 144, which has been sufficiently crystallized by a heat treatment, is etching resistant. Therefore, the crystallized oxide semiconductor layer 144 can be used as a mask to prevent the oxide semiconductor layer 144 from being lost when the metal oxide film 130 is patterned. The metal oxide film 130 is etched using the polycrystallized oxide semiconductor layer 144 as a mask in the above process. Wet etching or dry etching may be used to etch the metal oxide film 130. For example, diluted hydrofluoric acid (DHF) is used as the wet etching. By etching the metal oxide film 130 using the oxide semiconductor layer 144 as a mask, the photolithography process can be omitted.

Figure 10:
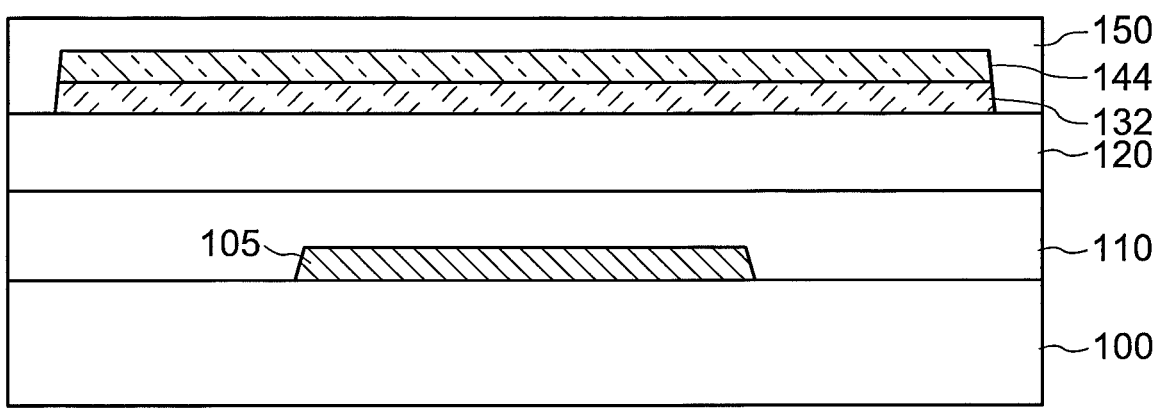
FIG. 10 is a cross-sectional view showing a manufacturing method of a semiconductor device according to an embodiment of the present invention.

As shown in FIG. 3 and FIG. 10, the gate insulating film 150 is deposited on the oxide semiconductor layer 144 ("Depositing GI" in step S1007 shown in FIG. 3).

The explanation of the gate insulating films 110 and 120 may be referred to with regards to the film-forming methods and insulating materials of the gate insulating film 150. For example, the thickness of the gate insulating film 150 is 50 nm or more and 300 nm or less, 60 nm or more and 200 nm or less, or 70 nm or more and 150 nm or less.

It is preferable to use an insulating material containing oxygen as the gate insulating film 150. It is preferable to use a less defective insulating film as the gate insulating film 150. For example, in the case where the composition ratio of oxygen in the gate insulating film 150 is compared with the composition ratio of oxygen in an insulating film having a composition similar to that of the gate insulating film 150 (hereinafter referred to as "another insulating film"), the composition ratio of oxygen in the gate insulating film 150 is closer to the stoichiometric ratio with respect to the insulating film than the composition ratio of oxygen in the other insulating film. For example, in the case where silicon oxide ($SiO_x$) is used for each of the gate insulating film 150 and the insulating film 180, the composition ratio of oxygen in the silicon oxide used as the gate insulating film 150 is closer to the stoichiometric ratio of silicon oxide compared with the composition ratio of oxygen in the silicon oxide used as the insulating film 180. For example, a layer in which no defects are observed when evaluated by an electron spin resonance method (ESR) may be used as the gate insulating film 150.

In order to form a less defective insulating film as the gate insulating film 150, the gate insulating film 150 may be deposited at a deposition temperature of 350° C. or more. In addition, after the gate insulating film 150 is deposited, a process of implanting oxygen into part of the gate insulating film 150 may be performed. In the present embodiment, silicon oxide is formed at a deposition temperature of 350° C. or more in order to form a less defective insulating film as the gate insulating film 150.

With the gate insulating film 150 deposited on the oxide semiconductor layer 144, a heat treatment (Annealing for Oxidation) is performed to supply oxygen to the oxide semiconductor layer 144 ("Annealing for Oxidation" in step S1008 shown in FIG. 3).

Oxygen released from the gate insulating film 120 by oxidation annealing is blocked by the metal oxide layer 132, so oxygen is unlikely to be supplied to the underside of the oxide semiconductor layer 144. The oxygen released from the gate insulating film 120 diffuses from the area where the metal oxide layer 132 is not formed to the gate insulating film 150 provided above the gate insulating film 120 and reaches the oxide semiconductor layer 144 through the gate insulating film 150. As a result, oxygen released from the gate insulating film 120 is hardly supplied to the bottom surface of the oxide semiconductor layer 144, but mainly to the side and top surfaces of the oxide semiconductor layer 144. Furthermore, oxidation annealing supplies oxygen released from the gate insulating film 150 to the top and side surfaces of the oxide semiconductor layer 144. Although hydrogen may be released from the gate insulating films 110 and 120 by the above oxidation annealing, the hydrogen is blocked by the metal oxide layer 132.

In the process between the deposition of the oxide semiconductor layer 144 and the deposition of the gate insulating film 150 on top of the oxide semiconductor layer 144, many oxygen defects are generated on the top surface and sides of the oxide semiconductor layer 144. By the above oxidation annealing, oxygen released from the gate insulating film 120 is supplied to the top and side surfaces of the oxide semiconductor layer 144, and the oxygen defects are repaired.

Figure 11:
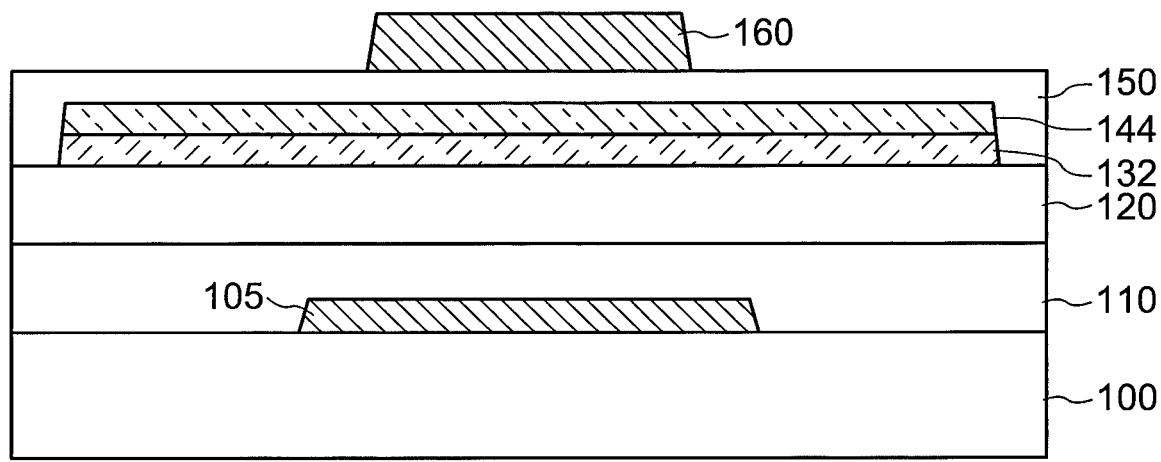
FIG. 11 is a cross-sectional view showing a manufacturing method of a semiconductor device according to an embodiment of the present invention.

As shown in FIG. 3 and FIG. 11, the gate electrode 160 is formed on the gate insulating film 150 ("Forming Top GE" in step S1009 shown in FIG. 3).

The gate electrode 160 is formed by processing a conductive film deposited by the sputtering method. As the gate electrode 160, a common metallic material is used in the same way as the gate electrode 105. For materials that can be used for the gate electrode 160, refer to the description of materials for the gate electrode 105. The above materials may be used as the gate electrode 160 in a single layer or in a stacked layer.

Figure 12:
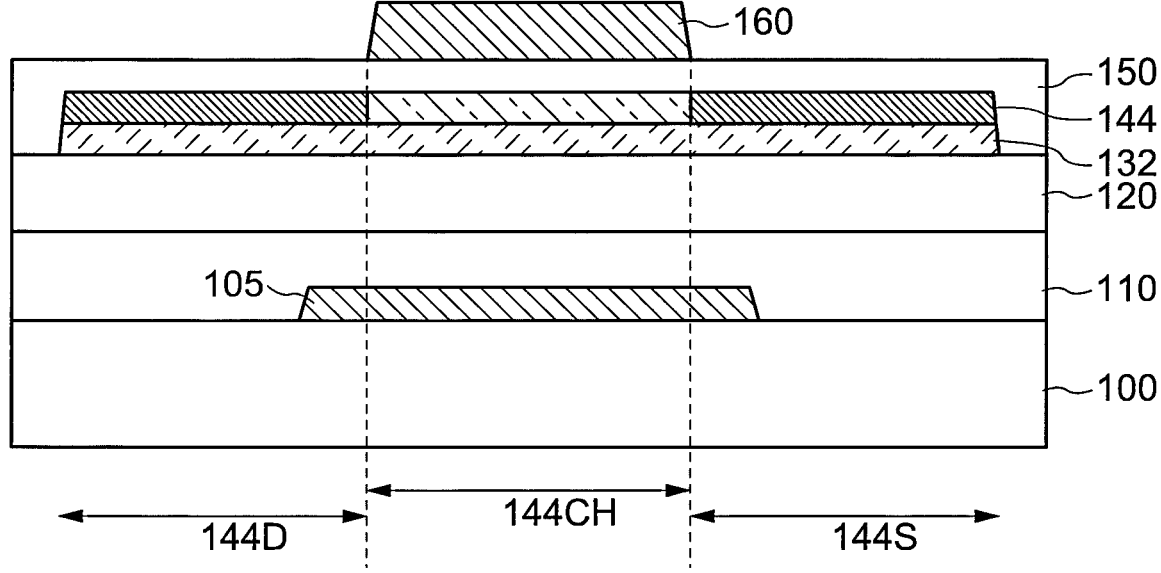
FIG. 12 is a cross-sectional view showing a manufacturing method of a semiconductor device according to an embodiment of the present invention.

As shown in FIG. 3 and FIG. 12, impurities are added to the oxide semiconductor layer 144 using the gate electrode 160 as a mask ("SD low-resistance" in step S1010 shown in FIG. 3). In the present embodiment, the case where impurities are added by ion implantation is described, but it may be performed by an ion doping method.

Specifically, an impurity element is added to the source area 144S and the drain area 144D by ion implantation, passing through the gate insulating film 150. For example, argon (Ar), phosphorus (P), or boron (B) may be used as the impurity element. In addition, in the case where boron (B) is added by the ion-implantation method, the acceleration energy may be set to 20 keV or more and 40 keV or less, and the implantation amount of boron (B) may be set to $1\times10^{14}$ cm$^{-2}$ or more and $1\times10^{16}$ cm$^{-2}$ or less.

Impurity elements can be added to the source area 144S and drain area 144D at a concentration of $1\times10^{18}$ cm$^{-3}$ to $1\times10^{21}$ cm$^{-3}$. In this case, oxygen defects are formed in the oxide semiconductors in the source area 144S and drain area 144D due to the addition of impurity elements. Hydrogen is easily trapped in the oxygen defects. This reduces the resistivity of the source area 144S and the drain area 144D, allowing them to function as conductors.

For example, when using an IGZO-based oxide semiconducting layer, the resistance of the source and drain areas cannot be sufficiently reduced without increasing the film thickness because of the high resistance of the oxide semiconductor layer. In contrast, in the oxide semiconductor layer 144 having a polycrystalline structure, impurity elements are added to the source area 144S and the drain area 144D to reduce the sheet resistance of the source area 144S and the drain area 144D to 1000 Ω/sq. or less, preferably 500 Ω/sq. or less, and even more preferably 250 Ω/sq. or less.

Figure 13:
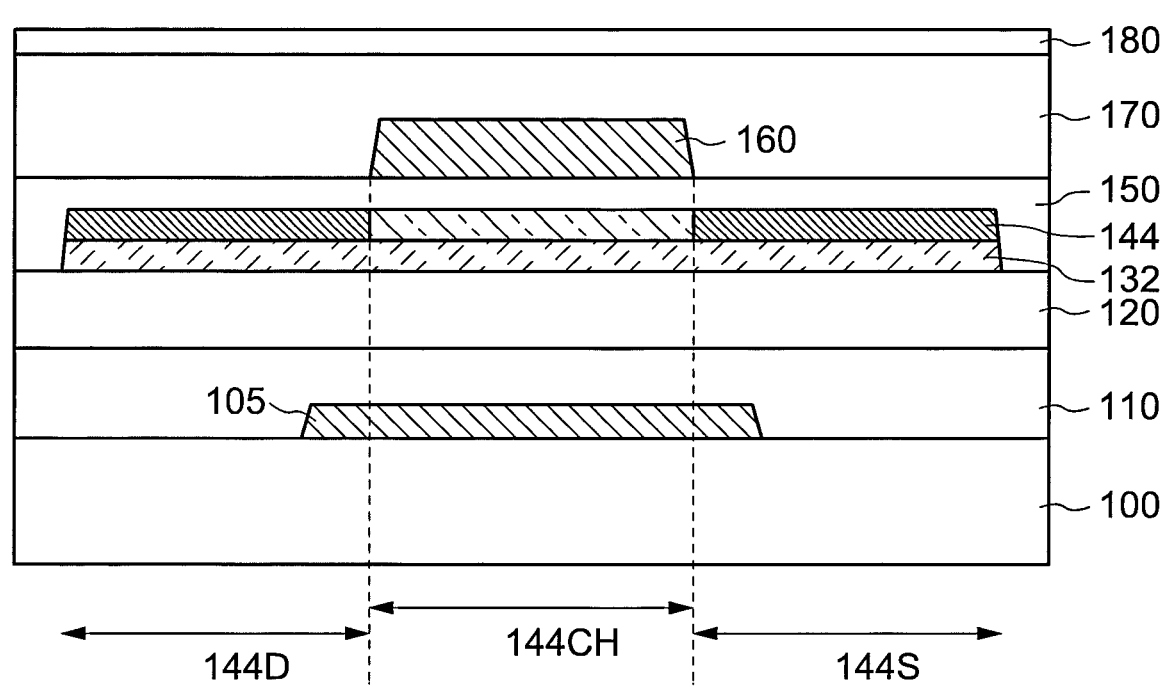
FIG. 13 is a cross-sectional view showing a manufacturing method of a semiconductor device according to an embodiment of the present invention.

As shown in FIG. 3 and FIG. 13, the insulating films 170 and 180 are formed as interlayer films on the gate insulating film 150 and the gate electrode 160 ("Depositing Interlayer Film" in step S1011 shown in FIG. 3).

For an explanation of the insulating films 170 and 180, it is possible to refer to the explanation of the film-forming method and insulating materials of the gate insulating films 110 and 120. A thickness of the insulating film 170 is 50 nm or more and 500 nm or less. A thickness of the insulating film 180 is 50 nm or more and 500 nm or less. In the present embodiment, for example, silicon nitride is formed as the insulating film 170, and silicon oxide is formed as the insulating film 180.

Figure 14:
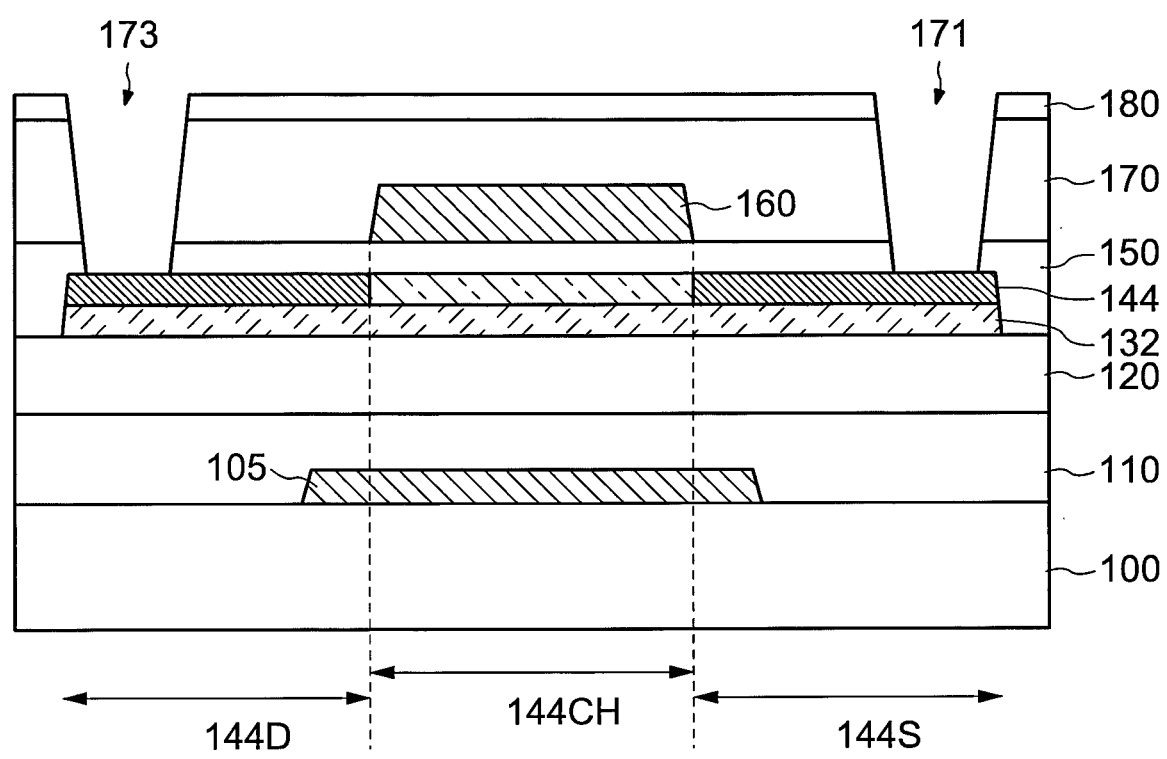
FIG. 14 is a cross-sectional view showing an outline of a semiconductor device according to an embodiment of the present invention.

As shown in FIG. 3 and FIG. 14, the openings 171 and 173 are formed in the gate insulating film 150 and the insulating films 170 and 180 ("Opening Contact Hole" in step S1012 shown in FIG. 3). The oxide semiconductor layer 144 of the source area 144S is exposed by the opening 171.

The oxide semiconductor layer 144 of the drain area 144D is exposed by the opening 173.

Next, the semiconductor device 10 shown in FIG. 1 can be formed by forming the source electrode and the drain electrode 200 on the oxide semiconductor layer 144 and on the insulating film 180 exposed by the openings 171 and 173 ("Forming SD" in step S1013 shown in FIG. 3).

For example, the source electrode and the drain electrode 200 is formed by the sputtering method. A general metal material is used as the source electrode and the drain electrode 200 as with the gate electrode 105. For materials that can be used for the source and the drain electrodes 200, refer to the description of the gate electrode 105. The above-described material may be used in a single layer or in a stacked layer as the source electrode and the drain electrode 200.

By the above process, the semiconductor device 10 shown in FIG. 1 can be manufactured.

In the semiconductor device 10 manufactured by the above-described manufacturing method, it is possible to obtain electrical properties having a mobility of 30 cm$^2$/Vs or more, 35 cm$^2$/Vs or more, or 40 cm$^2$/Vs or more in a range where the channel length L of the channel area 144CH is 2 μm or more and 4 μm or less and a channel width of the channel area 144CH is 2 μm or more and 25 μm or less. The mobility in the present embodiment means a field-effect mobility in a saturated area of the semiconductor device 10, and it means the maximum value of the field-effect mobility in an area where a potential difference (Vd) between the source electrode and the drain electrode is greater than a value (Vg–Vth) obtained by subtracting a threshold voltage (Vth) of the semiconductor device 10 from a voltage (Vg) supplied to the gate electrode.

Here, reliability test means, for example, a Negative Gate Bias-Temperature (NGBT) stress test in which a negative voltage is applied to the gate, or a Positive Gate Bias-Temperature (PGBT) stress test in which a positive voltage is applied to the gate. BT stress tests such as NGBT and PGBT, are a type of accelerated test that can be used to evaluate changes in transistor characteristics (aging changes) that occur after long-term use in a short period of time. In particular, the amount of change in the threshold voltage of the transistor before and after the BT stress test is an important indicator of reliability. The smaller the amount of change in the threshold voltage before and after the BT stress test, the more reliable the transistor is.

The ΔL length can be reduced by decreasing the thickness of the oxide semiconductor layer 144. In the present embodiment, hydrogen is implanted into the oxide semiconductor layer 144 using the gate electrode 160 as a mask. At this time, in the oxide semiconductor layer 144, a hydrogen-infiltrated region may occur in the channel region 144CH with respect to the edge of the gate electrode 160. The ΔL length refers to the length in the channel length L direction of the hydrogen-infiltrated region in the channel region 144CH. When the oxide semiconductor layer 144 is thin, as in the present embodiment, hydrogen is launched through the oxide semiconductor layer 144 to the gate insulating film 120 side during ion implantation. This suppresses hydrogen from diffusing into the channel region 144CH, which is thought to reduce the ΔL length.

Second Embodiment

The present embodiment describes a manufacturing method different from the manufacturing method of the semiconductor device 10 described in the first embodiment.

The structure of the semiconductor device 10 in the present embodiment is identical in appearance to the semiconductor device 10 described in the first embodiment. In the present embodiment, the description will focus on the points that differ from the first embodiment.

Manufacturing Method of Semiconductor Device

Figure 15:
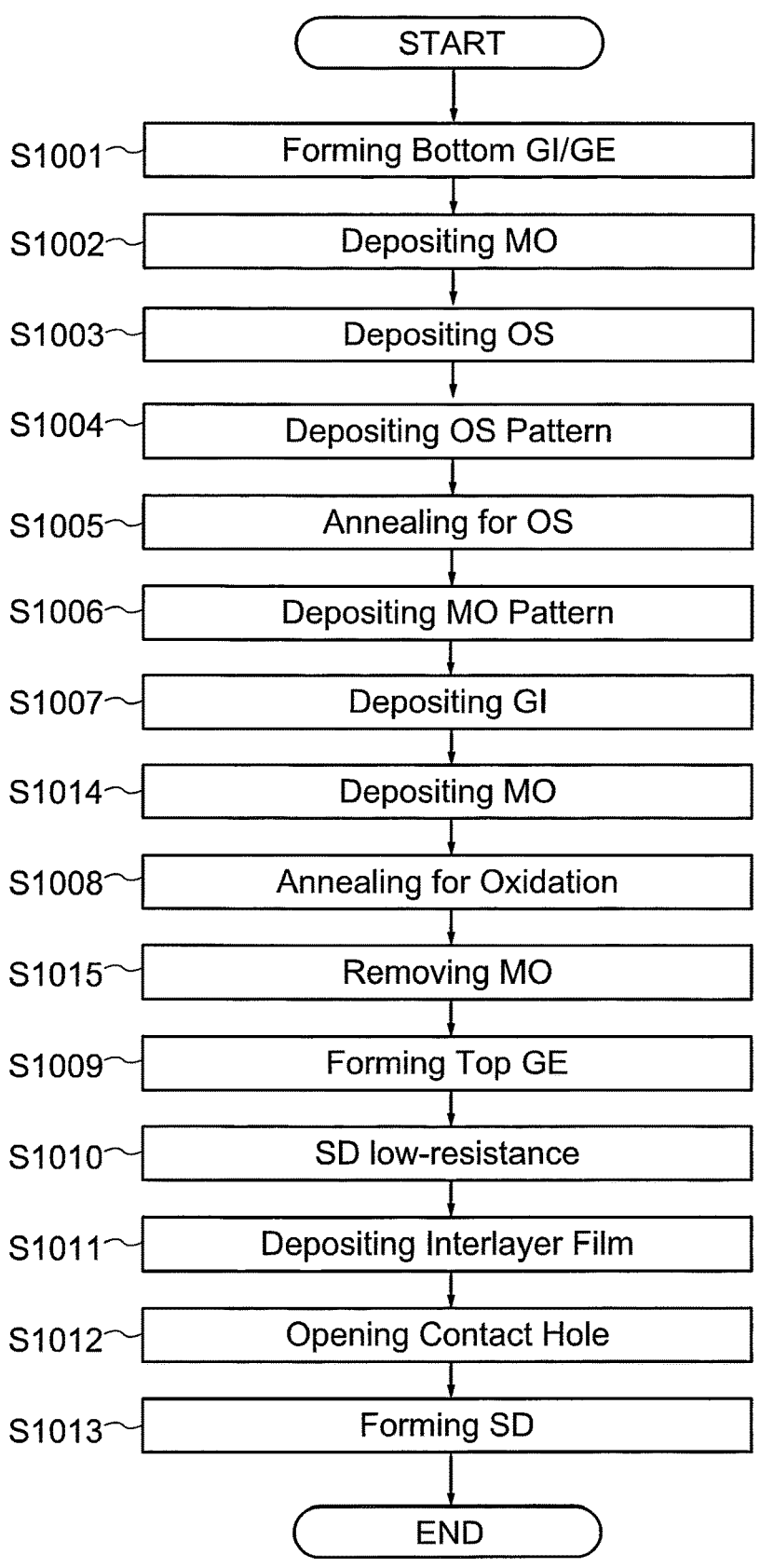
FIG. 15 is a sequence diagram showing a manufacturing method of a semiconductor device according to an embodiment of the present invention.
Figure 16:
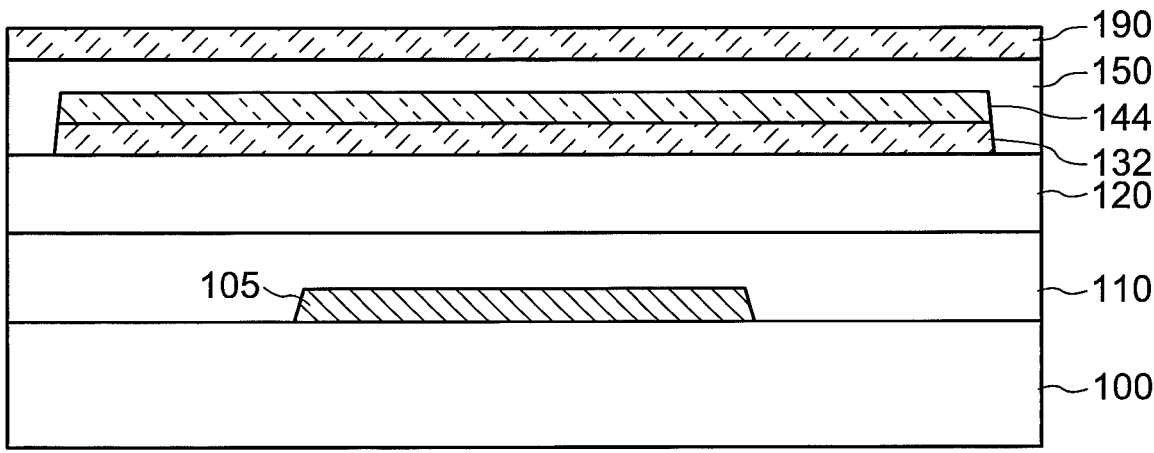
FIG. 16 is a cross-sectional view showing a manufacturing method of a semiconductor device according to an embodiment of the present invention.

FIG. 15 and FIG. 16 are used to describe a manufacturing method of the semiconductor device 10 according to an embodiment of the present invention. FIG. 15 is a sequence diagram showing the manufacturing method of the semiconductor device 10 according to an embodiment of the present invention. FIG. 16 is a cross-sectional view showing the method for manufacturing the semiconductor device 10 according to an embodiment of the present invention. Detailed descriptions of processes similar to those of the first embodiment are omitted.

FIG. 15 is a sequence diagram showing a manufacturing method for a semiconductor device 10 according to an embodiment of the present invention. As shown in FIG. 15, the process of steps S1001 to S1007 is similar to the process of steps S1001 to S1007 shown in FIG. 3.

In the present embodiment, as shown in FIG. 15 and FIG. 16, after the process of step S1007, a metal oxide film 190 with aluminum as the main component is deposited on the gate insulating film 150 (step S1014 "Depositing MO" shown in FIG. 15).

The metal oxide film 190 is deposited by the sputtering method. During the deposition of the metal oxide film 190, oxygen is implanted into the gate insulating film 150. The aluminum-based metal oxide film 190 is an inorganic insulating film similar to the metal oxide film 130 described in the first embodiment. The ratio of aluminum in the metal oxide film 190 may be between 5% or more and 70% or less, between 10% or more and 60% or less, or between 30% or more and 50% or less of the total metal oxide film 190. The above ratios may be by mass or by weight.

For example, the thickness of the metal oxide film 190 is 5 nm or more and 100 nm or less, 5 nm or more and 50 nm or less, 5 nm or more and 30 nm or less, or 7 nm or more and 15 nm or less. In the present embodiment, aluminum oxide is used as the metal oxide film 190. Aluminum oxide has high barrier properties against gases. In the present embodiment, the aluminum oxide used as the metal oxide film 190 suppresses the outward diffusion of oxygen that is launched into the gate insulating film 150 during the deposition of the metal oxide film 190.

For example, when the metal oxide film 190 is deposited by sputtering, the process gas used in sputtering remains in the film of the metal oxide film 190. For example, if Ar is used as the process gas for sputtering, Ar may remain in the metal oxide film 190. The residual Ar can be detected by SIMS (Secondary Ion Mass Spectrometry) analysis of the metal oxide film 190.

Next, as shown in FIG. 15, with the metal oxide film 190 deposited on the gate insulating film 150, a heating process ("Annealing for OS" in step S2008 of FIG. 15) is performed to supply oxygen to the oxide semiconductor layer 144. In the process between the deposition of the oxide semiconductor film 140 and the deposition of the gate insulating film 150 on the oxide semiconductor layer 144, many oxygen defects are generated on the top 141 and sides of the oxide semiconductor layer 144. Through the above oxidative annealing, oxygen released from the gate insulating films 120 and 150 is supplied to the oxide semiconductor layer 144, and the oxygen defects are repaired.

Oxygen released from the gate insulating film 120 by oxidation annealing is blocked by the metal oxide layer 132, so that oxygen is unlikely to be supplied to the underside of the oxide semiconductor layer 144. The oxygen released from the gate insulating film 120 diffuses from the area where the metal oxide layer 132 is not formed to the gate insulating film 150 provided above the gate insulating film 120 and reaches the oxide semiconductor layer 144 through the gate insulating film 150. As a result, oxygen released from the gate insulating film 120 is hardly supplied to the bottom surface of the oxide semiconductor layer 144, but mainly to the side and top surfaces of the oxide semiconductor layer 144. Furthermore, oxidation annealing supplies oxygen released from the gate insulating film 150 to the top and side surfaces of the oxide semiconductor layer 144. Although hydrogen may be released from the gate insulating films 110 and 120 by the above oxidation annealing, the hydrogen is blocked by the metal oxide layer 132.

As described above, the oxidation annealing process can supply oxygen to the top 141 and sides of the oxide semiconductor layer 144, which has a large amount of oxygen defects, while suppressing the supply of oxygen to the bottom surface of the oxide semiconductor layer 144, which has a small amount of oxygen defects.

Similarly, in the above oxidation annealing, the oxygen implanted into the gate insulating film 150 is blocked by the metallic oxide film 190, and thus is suppressed from being released into the atmosphere. Therefore, the oxygen is efficiently supplied to the oxide semiconductor layer 144 by the oxidation annealing, and oxygen defects are repaired.

Next, after the oxidation annealing, the metal oxide film 190 is etched (removed) ("Removing MO" in step S1015 shown in FIG. 15). Wet etching or dry etching may be used to etch the metal oxide film 190. For example, as wet etching, diluted hydrofluoric acid (DHF) is used. The etching removes the metal oxide film 190 formed on the entire surface. In other words, the removal of the metal oxide film 190 is performed without using a mask. In other words, the etching removes all of the metal oxide film 190 in the area overlapping the oxide semiconductor layer 144 formed in at least one pattern in a plan view.

After that, the gate electrode 160 is formed on the gate insulating film 150 ("Top GE formation" in step S1009 shown in FIG. 15). The process shown in Steps S1009 to S1013 is the same as Steps S1009 to S1013 shown in FIG. 3, so the description is omitted. By going through Step S1009 to Step S1013, the semiconductor device 10 shown in FIG. 15 can be formed.

In the semiconductor device 10 manufactured by the above manufacturing method, the oxygen defects in the oxide semiconductor layer 144 can be reduced more than in the manufacturing method of the semiconductor device 10 described in the first embodiment. Accordingly, in the semiconductor device 10 described in the present embodiment, in a range wherein the channel length L of the channel region 144CH is between 2 μm and 4 μm and the channel width of the channel region 144CH is between 2 μm and 25 μm, a mobility of 50 cm$^2$/Vs or more, 55 cm$^2$/Vs or more, or 60 cm$^2$/Vs or more electrical characteristics can be obtained.

In the first and second embodiments, a plasma treatment may be performed after forming the metal oxide film 130. In this disclosure, a plasma treatment refers to a treatment in which the substrate to be treated is exposed to plasma by generating plasma in a space in which the substrate to be treated is installed. A plasma treatment is performed, for example, by reverse sputtering using a sputtering device or by etching using an inductively coupled plasma (ICP: Inductively Coupled Plasma) device.

Reverse sputtering is a process to modify the surface of a substrate by forming plasma near the substrate and impinging ions on the surface of the substrate by applying a voltage to the substrate side using an RF power source in an argon atmosphere, without applying voltage to the target side. When a plasma treatment is performed by reverse sputtering, for example, argon gas is introduced into the chamber to generate plasma before the oxide semiconductor film 140 is deposited by a sputtering method. Etching with inductively coupled plasma is a process in which the surface of the substrate is modified by the ions and radicals present in the plasma.

The surface of the metal oxide film 130 is modified by plasma processing on the metal oxide film 130. Here, the surface is modified means that the chemical composition of the surface of the metal oxide film 130 is changed or the surface roughness of the metal oxide film 130 is reduced.

The state of the metal oxide film 130 with a modified surface can be confirmed by the size of the water contact angle of the surface. The water contact angle of the metal oxide film 130 decreases as a result of a plasma treatment on the surface of the metal oxide film 130. The water contact angle on the surface of the metal oxide film 130 after a plasma treatment is 20° or less, preferably 15° or less, and more preferably 10° or less. In this disclosure, the water contact angle is the value measured according to ISO 19403-2:2017. When the metal oxide film 130 is performed by reverse sputtering as a plasma treatment, the water contact angle is 20° or less. When the metal oxide film 130 is etched by inductively coupled plasma, the water contact angle is 15° or less. The lower limit of the water contact angle measurement is 2°.

The surface of the metal oxide film 130 may be removed by a plasma treatment. The amount by which the surface of the metal oxide film 130 is removed is, for example, between 1 nm and 10 nm, or between 1 nm and 5 nm.

The roughness of the surface of the metal oxide film 130 may be reduced by the plasma treatment. The surface roughness (e.g., arithmetic mean roughness (Ra)) of the metal oxide film 130 may be, for example, 1 nm or less. The surface roughness can be evaluated using an atomic force microscope (AFM: Atomic Force Microscope).

In this variation, the surface of the metal oxide film 130 is modified. The oxide semiconductor film 140 with few crystalline components is deposited on the modified surface of the metal oxide film 130. OS annealing is then performed on the patterned oxide semiconductor layer 142, so that when the oxide semiconductor layer 142 crystallizes, the crystallization is inhibited by hydroxyl groups and water at the interface between the metal oxide film 130 and the oxide semiconductor layer 144. In other words, the interfacial level density at the interface between the metal oxide film 130 and the oxide semiconductor layer 144 can be further reduced. As a result, the reliability of the semiconductor device 10 can be further improved.

Third Embodiment

A display device 20 using a semiconductor device 10 according to an embodiment of the present invention will be described with reference to FIG. 17 to FIG. 20. In the embodiment described below, a structure in which the semiconductor device 10 described in the first embodiment is applied to a circuit of a liquid crystal display device will be described.

Outline of Display Device

Figure 17:
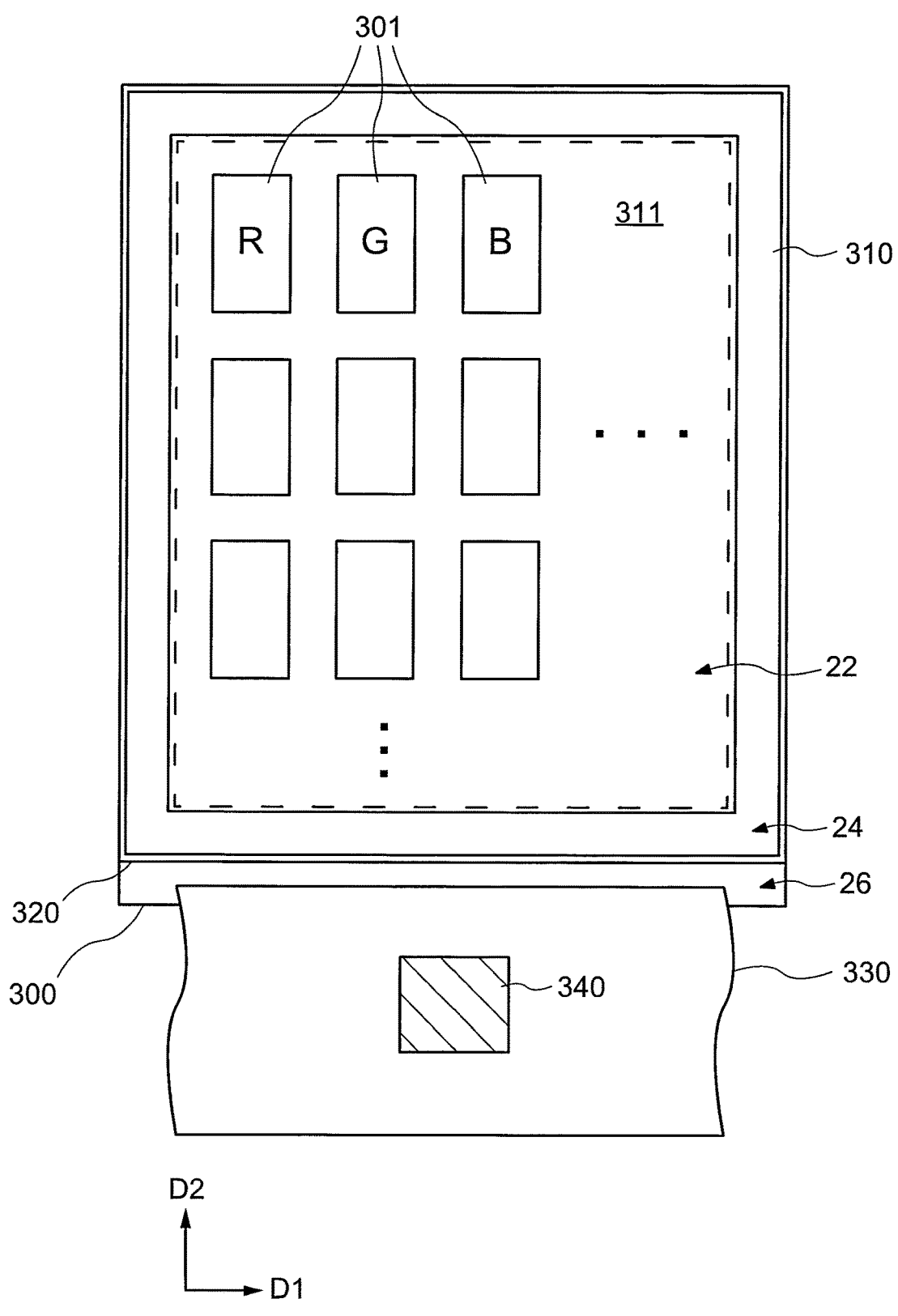
FIG. 17 is a plan view showing an outline of a display device according to an embodiment of the present invention.

FIG. 17 is a plan view showing an outline of a display device 20 according to an embodiment of the present invention. As shown in FIG. 17, the display device 20 includes an array substrate 300, a seal part 310, a counter substrate 320, a flexible printed circuit board 330 (FPC 330), and an IC chip 340. The array substrate 300 and the counter substrate 320 are bonded together by the seal part 310. A plurality of pixel circuits 301 is arranged in a matrix in a liquid crystal area 22 surrounded by the seal part 310. The liquid crystal area 22 is an area overlapping a liquid crystal element 311 described later in a plan view.

A seal area 24 arranged with the seal part 310 is an area around the liquid crystal area 22. The FPC 330 is arranged in a terminal area 26. The terminal area 26 is an area where the array substrate 300 is exposed from the counter substrate 320 and is arranged on the outside of the seal area 24. The outside of the seal area 24 means the outer side of the area arranged with the seal part 310 and the area surrounded by the seal part 310. The IC chip 340 is arranged on the FPC 330. The IC chip 340 supplies a signal for driving the pixel circuit 301.

Circuit Structure of Display Device

Figure 18:
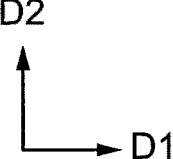
FIG. 18 is a block diagram showing a circuit structure of a display device according to an embodiment of the present invention.

FIG. 18 is a block diagram showing a circuit structure of a display device according to an embodiment of the present invention. As shown in FIG. 18, a gate driver circuit 303 is arranged at a position in contact with the liquid crystal area 22 on which the pixel circuit 301 is arranged in the second direction D2 (column direction), and a source driver circuit 302 is arranged at a position adjacent to the liquid crystal area 22 in the first direction D1 (row direction). The source driver circuit 302 and the gate driver circuit 303 are arranged in the seal area 24. However, the area where the source driver circuit 302 and the gate driver circuit 303 are arranged is not limited to the seal area 24, and any area may be used as long as it is outside the area where the pixel circuit 301 is arranged.

A source wiring 304 extends from the source driver circuit 302 in the second direction D2 and is connected to the plurality of pixel circuits 301 arranged in the second direction D2. The gate wiring 164GL extends from the gate driver circuit 303 in the first direction D1 and is connected to the plurality of pixel circuits 301 arranged in the first direction D1.

A terminal part 306 is arranged in the terminal area 26. The terminal part 306 and the source driver circuit 302 are connected by a connecting wiring 307. Similarly, the terminal part 306 and the gate driver circuit 303 are connected by the connecting wiring 307. Since the FPC 330 is connected to the terminal part 306, an external device to which the FPC 330 is connected is connected to the display device 20, and each pixel circuit 301 arranged in the display device 20 is driven by a signal from the external device.

The semiconductor device 10 according to the first embodiment and the second embodiment is used as a transistor included in the pixel circuit 301, the source driver circuit 302, and the gate driver circuit 303.

Pixel Circuit 301 of Display Device

Figure 19:
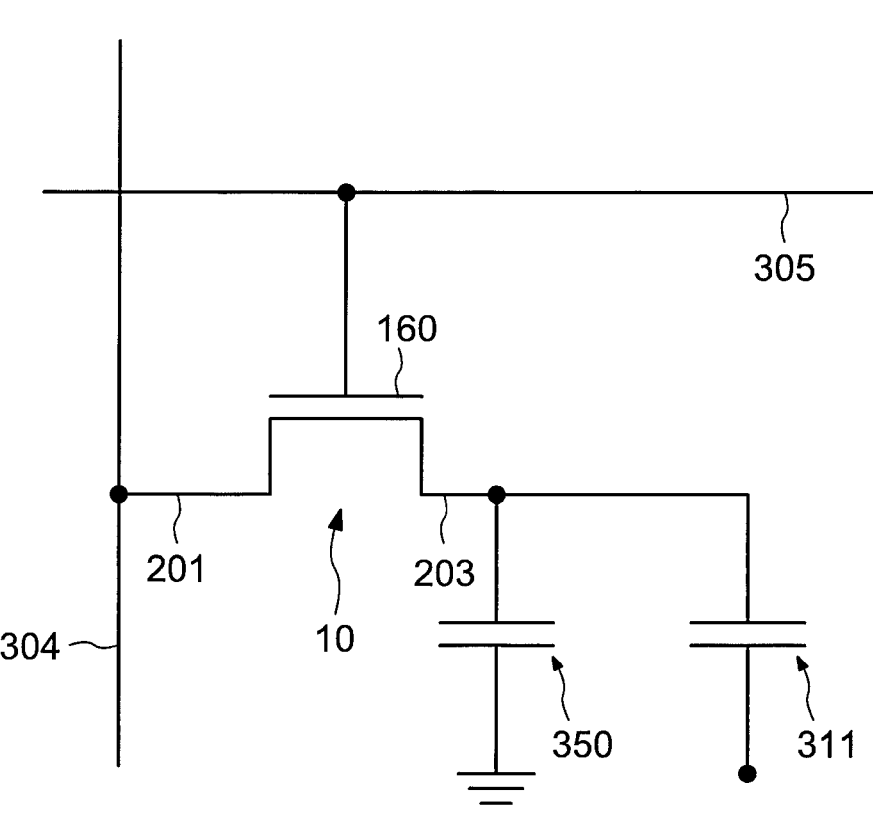
FIG. 19 is a circuit diagram showing a pixel circuit of a display device according to an embodiment of the present invention.

FIG. 19 is a circuit diagram showing a pixel circuit of the display device 20 according to an embodiment of the present invention. As shown in FIG. 19, the pixel circuit 301 includes elements such as the semiconductor device 10, a holding capacity 350, and the liquid crystal element 311. The semiconductor device 10 includes the gate electrode 160, the source electrode 201, and the drain electrode 203. The gate electrode 160 is connected to a gate wiring 305. The source electrode 201 is connected to the source wiring 304. The drain electrode 203 is connected to the holding capacity 350 and the liquid crystal element 311. In the present embodiment, for convenience of explanation, an electrode indicated by a reference sign "201" may be referred to as a source electrode, an electrode indicated by a reference sign "203" may be referred to as a drain electrode, but the electrode indicated by the reference sign "201" may function as a drain electrode, and the electrode indicated by the reference sign "203" may function as a source electrode.

Structure of Display Device

Figure 20:
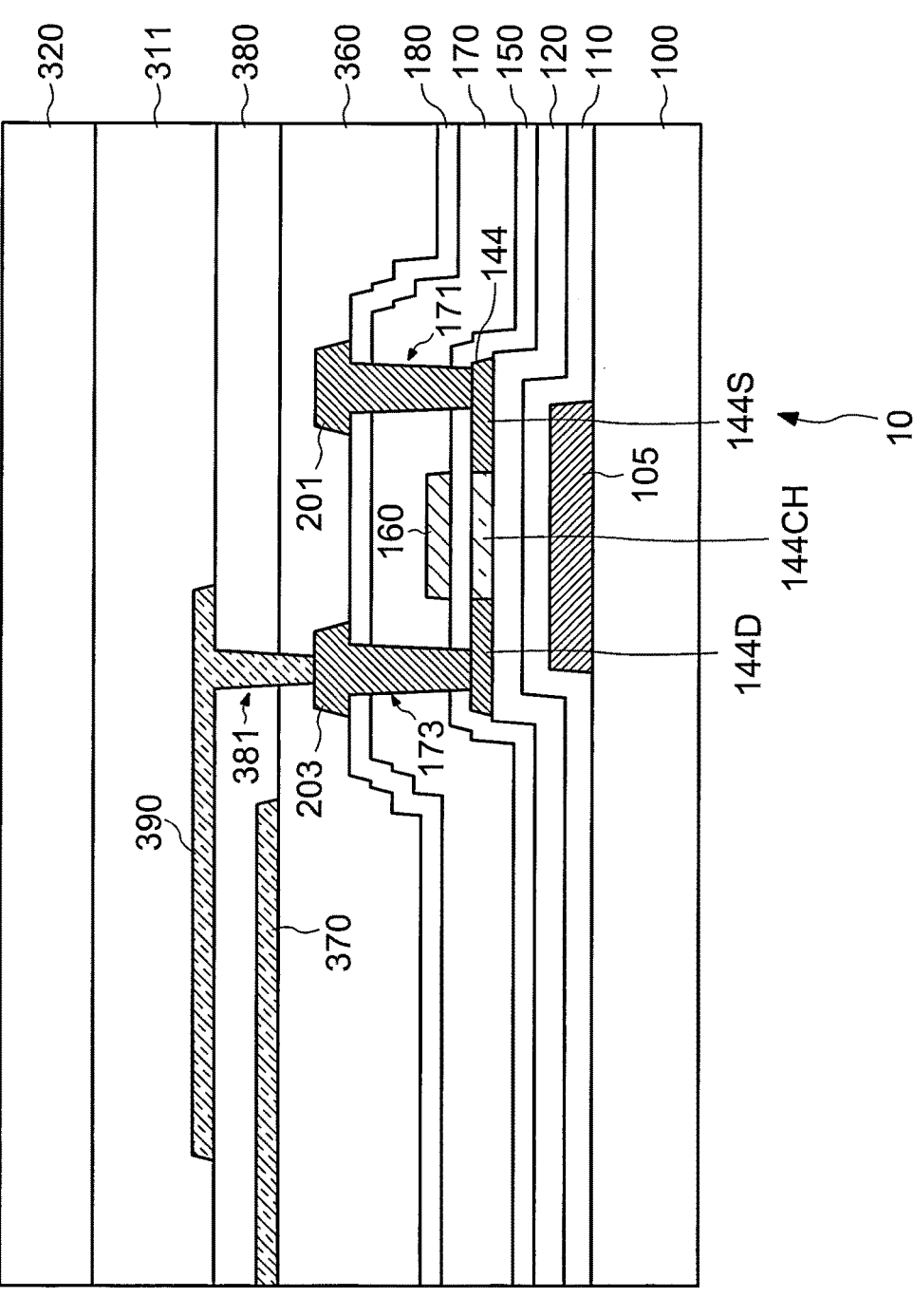
FIG. 20 is a cross-sectional view showing an outline of a display device according to an embodiment of the present invention.

FIG. 20 is a cross-sectional view of the display device 20 according to an embodiment of the present invention. As shown in FIG. 20, the display device 20 is the display device 20 to which the semiconductor device 10 is applied.

Figure 21:
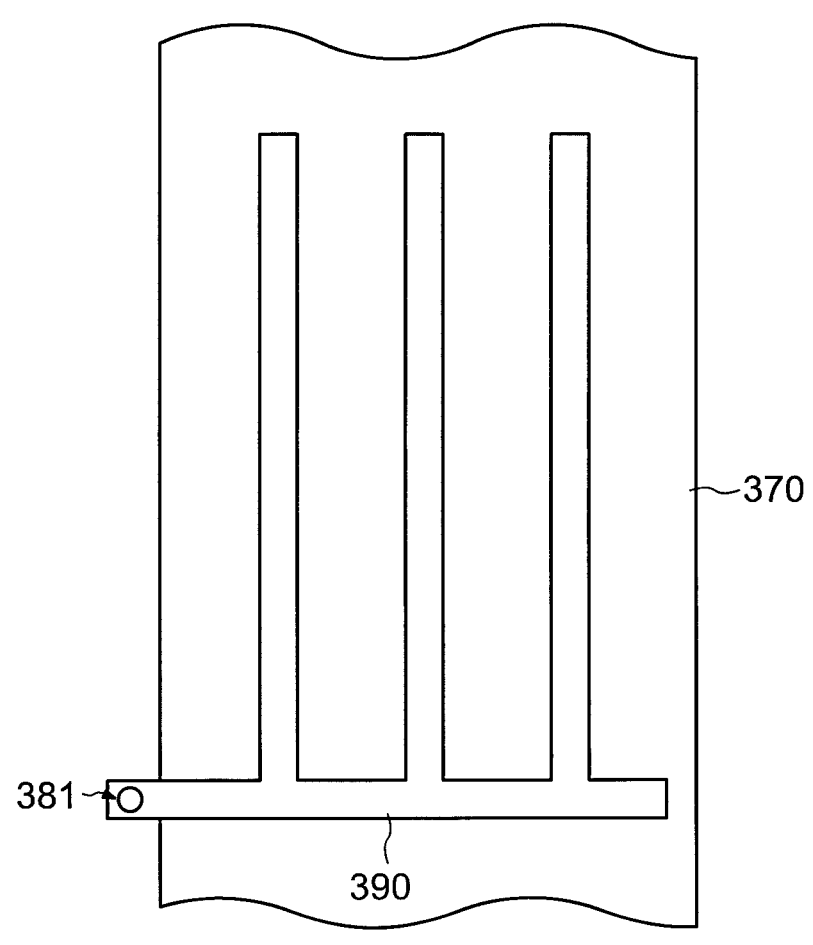
FIG. 21 is a plan view of a pixel electrode and a common electrode of a display device according to an embodiment of the invention.
Figure 21:
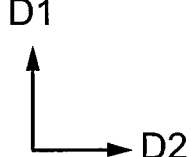

As shown in FIG. 20 and FIG. 21, the gate electrode 105 is arranged on the substrate 100. The gate electrode 105 is in a floating state. The explanation of the source electrode 201 and the drain electrode 203 may be referred to with regards to the materials of the gate electrode 105. In addition, the oxide semiconductor layer 144 is arranged on the gate electrode 105. The gate electrode 160 extends along the first direction D1 on the oxide semiconductor layer 144. An area of the gate electrode 160 that overlaps the oxide semiconductor layer 144 functions as the gate electrode 160. The source wiring 304 and the drain electrode 203 are arranged on the gate electrode 160. The source wiring 304 is connected to the source area 144S via the opening 171. An area of the source wiring 304 connected to the oxide semiconductor layer 144 functions as the source electrode 201. In addition, the drain electrode 203 is connected to the drain area 144D via the opening 173.

An insulating film 360 is arranged on the source electrode 201 and the drain electrode 203. A common electrode 370 commonly arranged in a plurality of pixels is arranged on the insulating film 360. An insulating film 380 is arranged on the common electrode 370. The opening 381 is arranged in the insulating films 360 and 380. A pixel electrode 390 is arranged on the insulating film 380 and inside the opening 381. The pixel electrode 390 is connected to the drain electrode 203.

FIG. 21 is a plan view of a pixel electrode and a common electrode of a display device according to an embodiment of the present invention. As shown in FIG. 21, the common electrode 370 has an overlapping area that overlaps the pixel electrode 390 in a plan view and a non-overlapping area that does not overlap the pixel electrode 390. In the case where a voltage is applied between the pixel electrode 390 and the common electrode 370, a lateral electric field is formed from the pixel electrode 390 in the overlapping area toward the common electrode 370 in the non-overlapping area. The lateral electric field causes liquid crystal molecules included in the liquid crystal device 311 to operate, thereby determining the gradation of the pixel.

In the present embodiment, although a structure in which the semiconductor device 10 is used for the pixel circuit 301 is exemplified, the semiconductor device 10 may be used for a peripheral circuit including the source driver circuit 302 and the gate driver circuit 303.

Fourth Embodiment

The display device 20 using the semiconductor device 10 according to an embodiment of the present invention will be described with reference to FIG. 22 and FIG. 23. In the present embodiment, a structure in which the semiconductor device 10 described in the first embodiment is applied to a circuit of the organic EL display device will be described.

Figure 22:
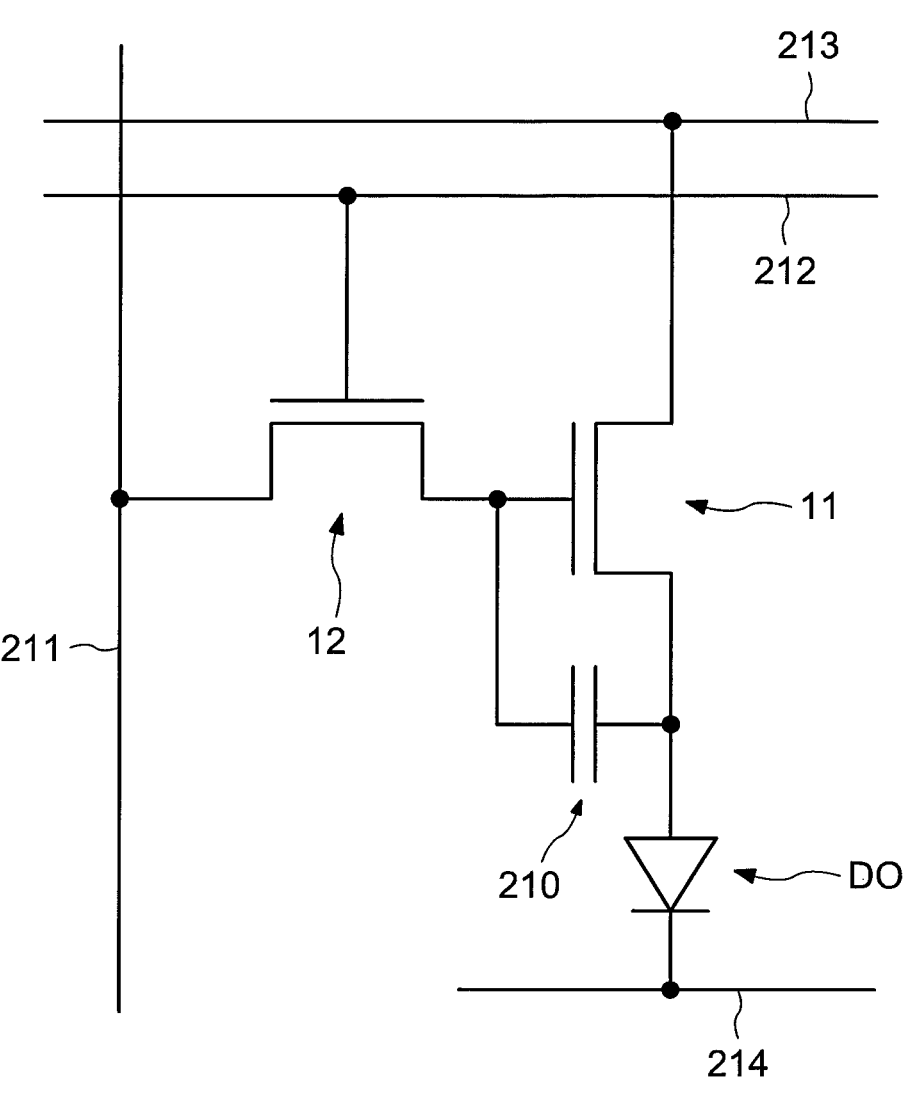
FIG. 22 is a circuit diagram showing a pixel circuit of a display device according to an embodiment of the present invention.
Figure 23:
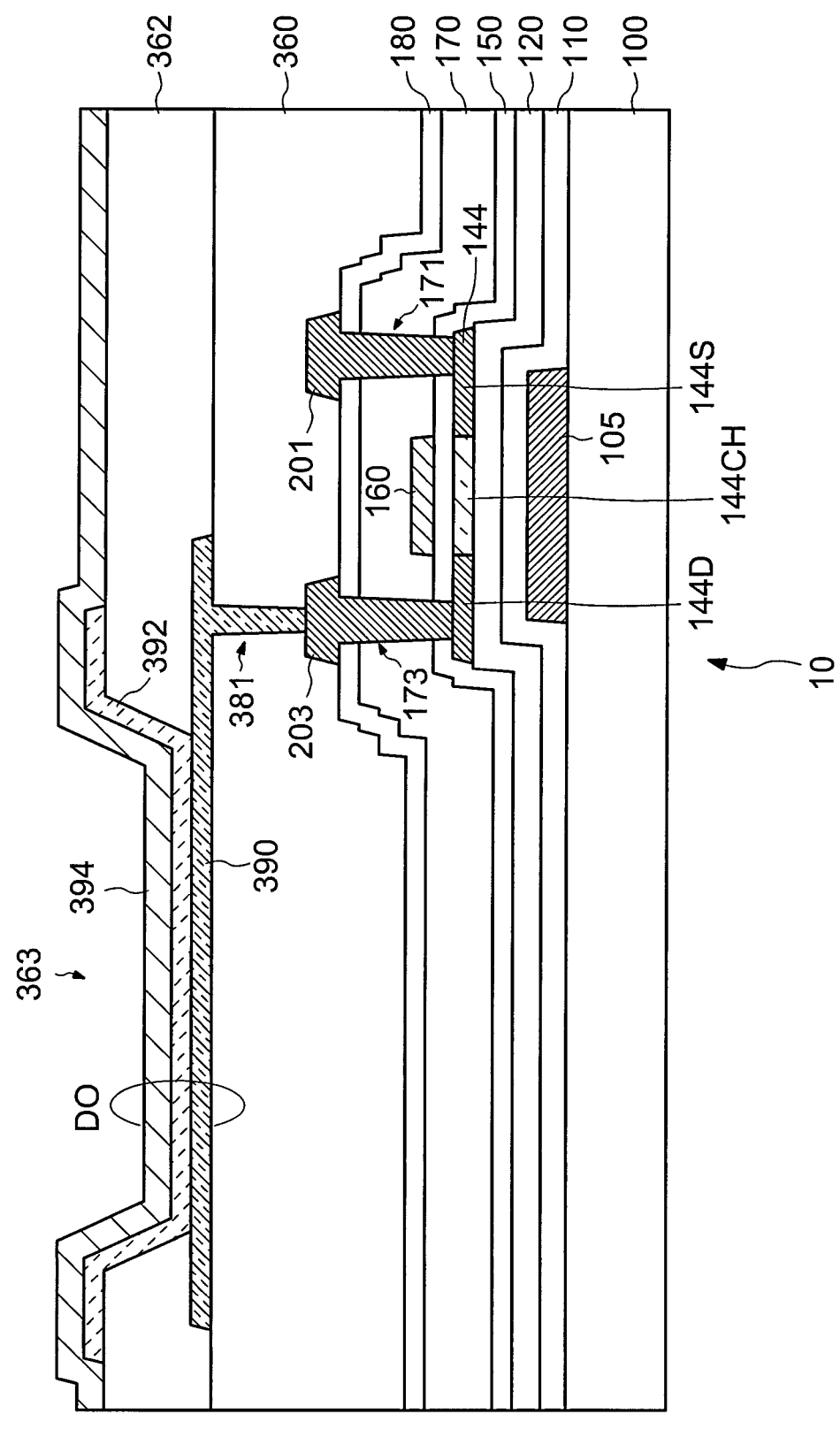
FIG. 23 is a cross-sectional view showing an outline of a display device according to an embodiment of the present invention.

Since the outline and the circuit structure of the display device 20 are the same as those shown in FIG. 22 and FIG. 23, the description thereof will be omitted.

Pixel Circuit 301 of Display Device

FIG. 22 is a circuit diagram showing a pixel circuit of a display device according to an embodiment of the present invention. As shown in FIG. 22, the pixel circuit 301 includes elements such as a drive transistor 11, a select transistor 12, a holding capacity 210, and a light-emitting element DO. The drive transistor 11 and the select transistor 12 have the same structure as that of the semiconductor device 10. A source electrode of the select transistor 12 is connected to a signal line 211, and a gate electrode of the select transistor 12 is connected to a gate line 212. A source electrode of the drive transistor 11 is connected to an anode power line 213, and a drain electrode of the drive transistor 11 is connected to one end of the light-emitting element DO. The other end of the light-emitting element DO is connected to a cathode power line 214. A gate electrode of the drive transistor 11 is connected to a drain electrode of the select transistor 12. The holding capacity 210 is connected to the gate electrode and the drain electrode of the drive transistor 11. The signal line 211 is supplied with a gradation signal that determines the emission intensity of the light-emitting element DO. The gate line 212 is supplied with a signal for selecting a pixel row in which the gradation signal is written.

Cross-Sectional Structure of Display Device

FIG. 23 is a cross-sectional view of the display device 20 according to an embodiment of the present invention. Although the structure of the display device 20 shown in FIG. 23 is similar to that of the display device 20 shown in FIG. 20, the structure above the insulating film 360 of the display device 20 in FIG. 23 is different from the structure above the insulating film 360 of the display device 20 in FIG. 20. Hereinafter, among the structures of the display device 20 shown in FIG. 23, the same structures as those of the display device 20 shown in FIG. 20 will be omitted, and differences between the two will be described.

As shown in FIG. 23, the display device 20 has the pixel electrode 390, a light-emitting layer 392, and a common electrode 394 (the light-emitting element DO) above the insulating film 360. The pixel electrode 390 is arranged on the insulating film 360 and inside the opening 381. An insulating film 362 is arranged on the pixel electrode 390. The insulating film 362 is arranged with an opening 363. The opening 363 corresponds to the light-emitting area. That is, the insulating film 362 defines a pixel. The light-emitting layer 392 and the common electrode 394 are arranged on the pixel electrode 390 exposed by the opening 363. The pixel electrode 390 and the light-emitting layer 392 are individually arranged for each pixel. On the other hand, the common electrode 394 is commonly arranged for the plurality of pixels. Different materials are used for the light-emitting layer 392 depending on the display color of the pixel.

In the third embodiment and the fourth embodiment, although the structure in which the semiconductor device described in the first embodiment is applied to the liquid crystal display device and the organic EL display device has been exemplified, the semiconductor device may be applied to a display device (for example, a self-luminous display device or an electronic paper type display device other than the organic EL display device) other than these display devices. In addition, the semiconductor device 10 can be applied to any display device ranging from small and medium-sized to large-sized without any particular limitation. Furthermore, the semiconductor device described in the second embodiment may be applied to the liquid crystal display device and the organic EL display device.

EXAMPLES

First Example

The present example describes the results of verification of etching resistance to the oxide semiconductor film 140.

In the present example, after the semiconductor device 10 was manufactured according to the sequence shown in FIG. 15 of the second embodiment, the presence of the oxide semiconductor layer 144 was checked by photographing the surface of the semiconductor device with an optical microscope.

In the present example, an aluminum oxide film of 10 nm was deposited as the metal oxide film 130 in step S1002 shown in FIG. 15. Next, in step S1003 shown in FIG. 15, an oxide semiconductor film 140 was deposited using an IGO-based sputtering target and a substrate temperature of 100° C. or less. The oxygen partial pressure and the thickness of the oxide semiconductor film were changed according to conditions.

When the oxygen partial pressure was 2%, the thickness of the semiconductor oxide film was set to 20 nm, 30 nm, and 40 nm. When the oxygen partial pressure is 4%, the thickness of the semiconductor oxide film is set to 20 nm, 30 nm, and 40 nm. When the oxygen partial pressure was 5%, the thickness was set to 30 nm.

In step S1004 shown in FIG. 15, the oxide semiconductor film 140 was etched with oxalic acid using a resist mask. In step S1005 shown in FIG. 15, OS annealing was performed. Then, in step S1006 shown in FIG. 15, the metal oxide film 130 was etched using DHF with the oxide semiconductor layer 144 as a mask. Thereafter, the semiconductor device 10 was manufactured according to the sequence shown in FIG. 15.

Figure 24:
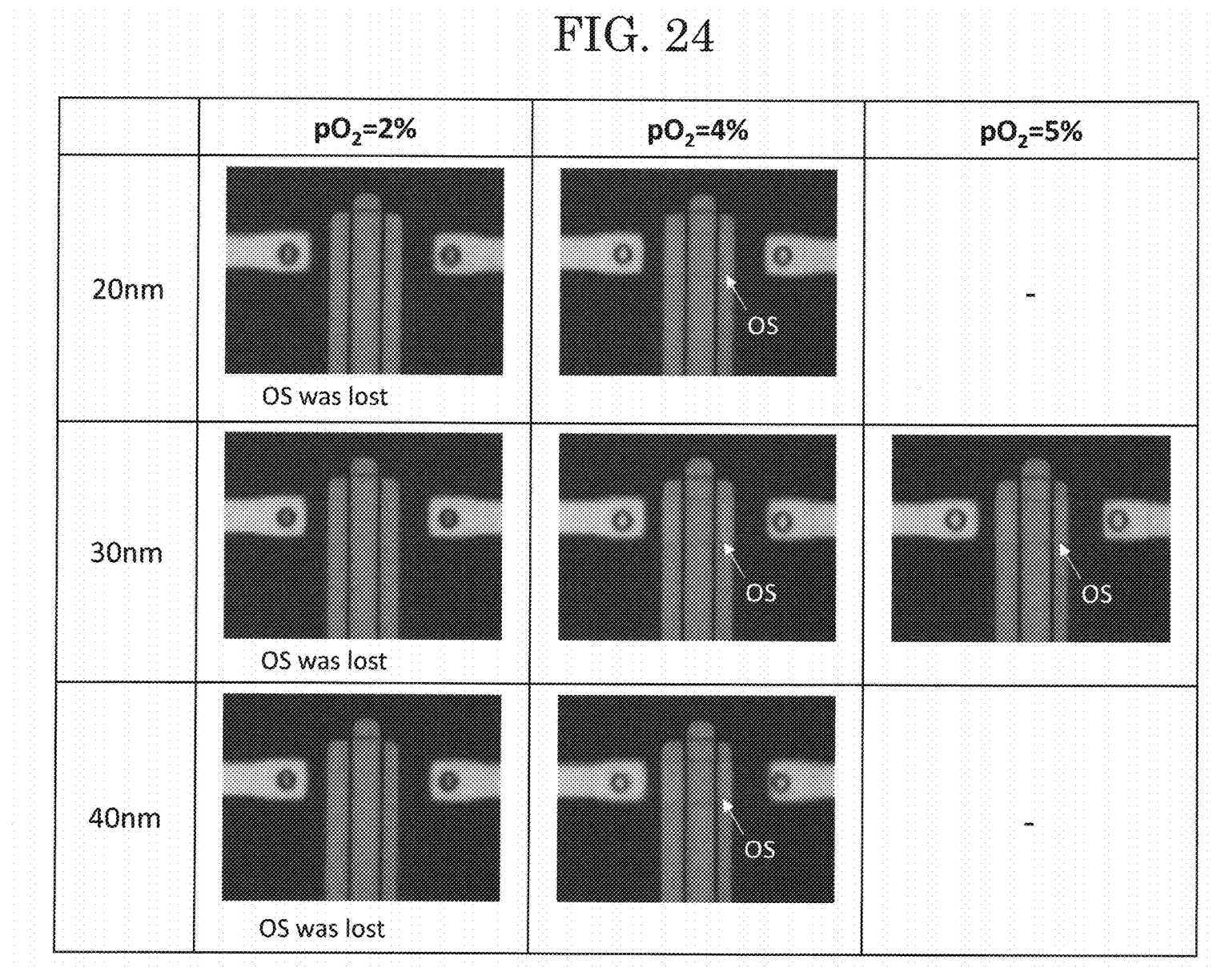

After the process of step S1013 shown in FIG. 15 was completed, a photograph of the surface of the semiconductor device was taken with an optical microscope. FIG. 24 shows a photograph of the surface of the semiconductor device taken with an optical microscope.

As shown in FIG. 24, when the oxygen partial pressure was 2%, the oxide semiconductor layer was confirmed to be have been lost during the etching process in all cases of the thickness of 20 nm, 30 nm, and 40 nm. When the oxygen partial pressure was 4% and when the oxygen partial pressure was 5%, it was confirmed that the oxide semiconductor layer was not lost but remained.

When the oxygen partial pressure is 2%, it is believed that the oxide semiconductor film could not be sufficiently crystallized even after heat treatment and after deposition of the oxide semiconductor film. Therefore, it is believed that when the metal oxide film 130 is etched, the oxide semiconductor layer is also lost. On the other hand, when the oxygen partial pressure is 3% or more, the oxide semiconductor layer is considered to have remained because the oxide semiconductor layer was sufficiently crystallized by the heat treatment after the oxide semiconductor film was deposited.

Second Example

Next, the results of verification of the electrical characteristics of the semiconductor device 10 manufactured according to the sequence shown in FIG. 3 of the first embodiment will be described.

In the present example, the oxide semiconductor film 140 was deposited in step S1003 shown in FIG. 3, using an IGO-based sputtering target and a substrate temperature of 100° C. or less. The oxygen partial pressure and the thickness of the oxide semiconductor film were changed according to conditions.

When the oxygen partial pressure is 5%, the thickness of the oxide semiconductor film was changed according to conditions to 10 nm, 20 nm, and 30 nm.

In step S1004 shown in FIG. 3, the oxide semiconductor film 140 was etched using a resist mask. In step S1005 shown in FIG. 3, OS annealing was performed. Thereafter, the semiconductor device 10 was fabricated according to the sequence shown in FIG. 3.

Next, the electrical characteristics of the semiconductor device 10 were measured. The measurement conditions for the electrical characteristics of the semiconductor device 10 were as follows.

Channel area size: W/L=4.5 $\mu$m/3 $\mu$m

Source-drain voltage: 0.1 V and 10 V

Gate voltage: −15V to +15V

Measurement environment: room temperature and dark room

Oxide semiconductor layer thickness: 10 nm, 20 nm, and 30 nm

Measurement points: 26 points on the substrate surface

Figure 25:
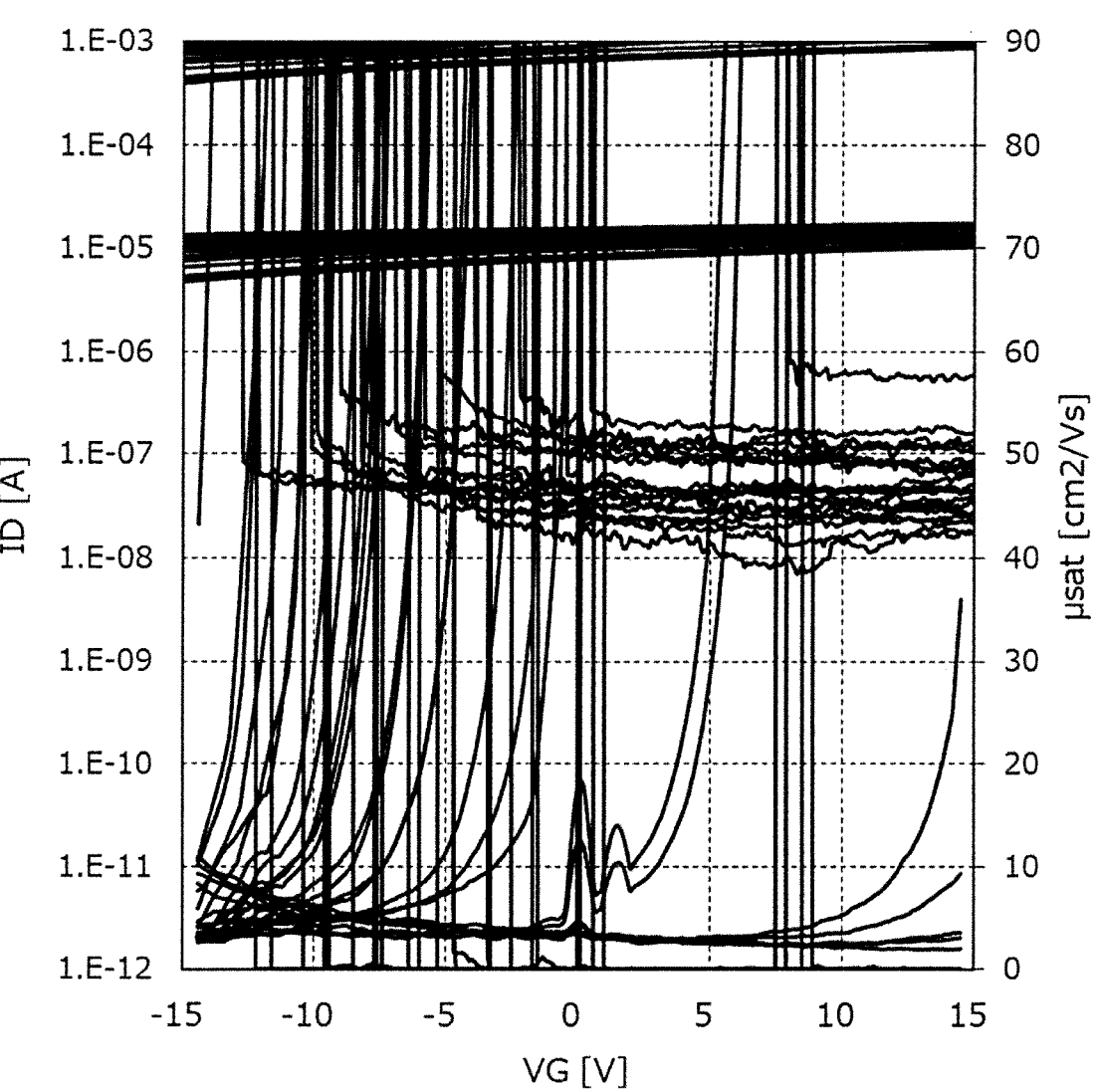
FIG. 25 shows the electrical characteristics (Id-Vg characteristics) of a semiconductor device 10 having an oxide semiconductor layer with a film thickness of 10 nm.
Figure 26:
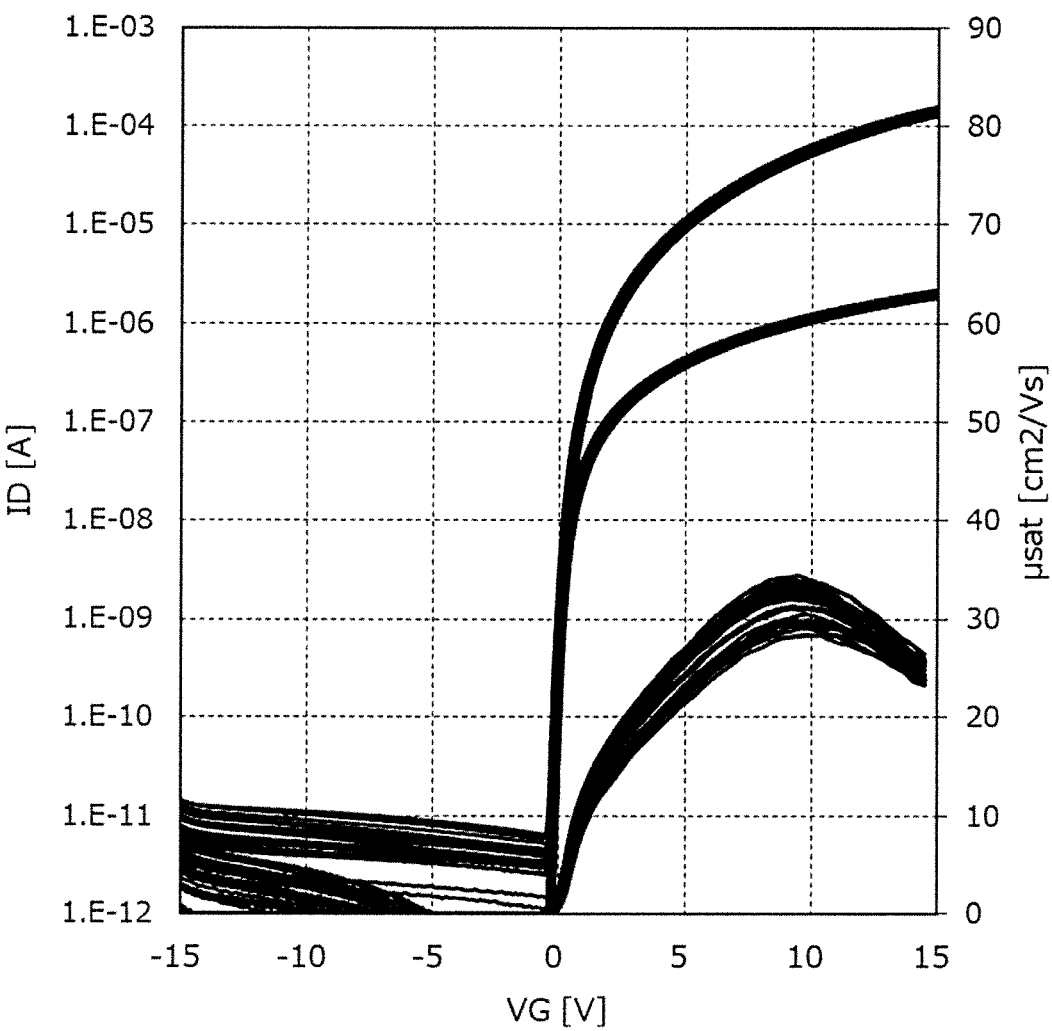
FIG. 26 shows the electrical characteristics (Id-Vg characteristics) of a semiconductor device 10 having an oxide semiconductor layer with a film thickness of 20 nm.
Figure 27:
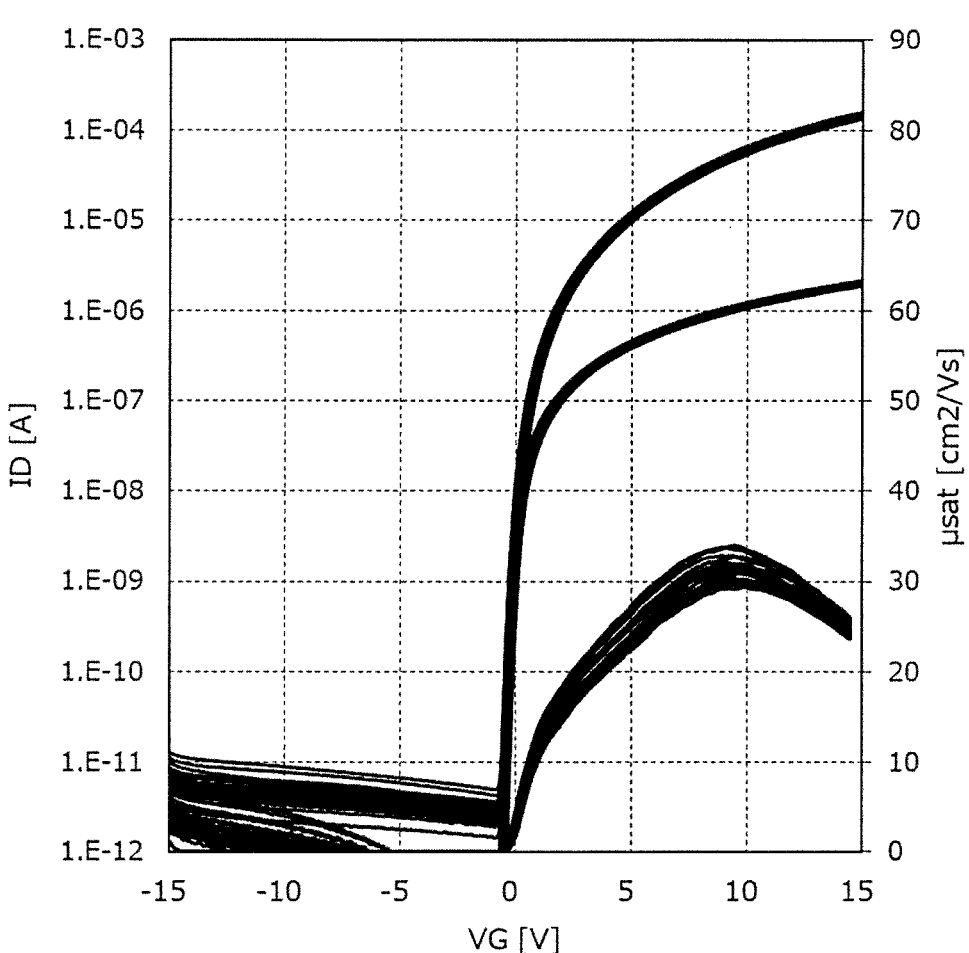
FIG. 27 shows the electrical characteristics (Id-Vg characteristics) of a semiconductor device 10 having an oxide semiconductor layer with a film thickness of 30 nm.

FIG. 25 shows the electrical characteristics (Id-Vg characteristics) of the semiconductor device 10 having the oxide semiconductor layer with a film thickness of 10 nm. FIG. 26 shows the electrical characteristics (Id-Vg characteristics) of the semiconductor device 10 having the oxide semiconductor layer with a film thickness of nm. FIG. 27 shows the electrical characteristics (Id-Vg characteristics) of the semiconductor device 10 having the oxide semiconductor layer with a film thickness of 30 nm. The horizontal axis is the gate voltage Vg, and the vertical axis is the drain current (Id).

As shown in FIG. 25, the switching characteristics could not be obtained in the semiconductor device 10 having an oxide semiconductor layer with a film thickness of 10 nm. It is believed to be because the oxide semiconductor layer was not crystallized by the heat treatment and remained amorphous when the oxide semiconductor layer thickness was 10 nm. In FIG. 26 and FIG. 27, good electrical characteristics were obtained for the semiconductor device 10. The mobility of the semiconductor device 10 with the oxide semiconductor layer having a film thickness of 20 nm was 31.5 cm²/Vs. The mobility of the semiconductor device 10 having an oxide semiconductor layer with a film thickness of 30 nm was 31.4 cm²/Vs.

Third Example

Next, the results of verifying the electrical characteristics of the semiconductor device 10 manufactured according to the sequence shown in FIG. 15 of the second embodiment will be described. In the present example, the oxygen partial pressure and the film thickness are further changed according to conditions in detail, and the results of verifying true mobility and reliability are described.

In the present example, an aluminum oxide film was deposited as the metal oxide film 130 in step S1002 shown in FIG. 15. In step S1003 shown in FIG. 15, an oxide semiconductor film 140 was deposited using an IGO-based sputtering target and a substrate temperature of less than 100° C. The oxygen partial pressure and the thickness of the oxide semiconductor film were changed according to conditions.

The thickness of the oxide semiconductor film was changed according to conditions to 15 nm, 20 nm, 25 nm, and 30 nm for oxygen partial pressures of 3%, 4%, and 5%, respectively.

In step S1004 shown in FIG. 15, the oxide semiconductor film 140 was etched with oxalic acid using a resist mask. In step S1005 shown in FIG. 15, OS annealing was performed. Then, in step S1006 shown in FIG. 15, the metal oxide film 130 was etched using DHF with the oxide semiconductor layer 144 as a mask. Thereafter, the semiconductor device 10 was manufactured according to the sequence shown in FIG. 15.

Next, the electrical characteristics of the semiconductor device 10 fabricated in the present example were measured. The measurement conditions for the electrical characteristics of the semiconductor device 10 are as follows.

Channel region 144CH size: W/L=4.5 μm/3 μm

Source-drain voltage: 0.1 V and 10 V

Gate voltage: −15V to +15V

Measurement environment: room temperature and dark room

Oxide semiconductor layer thickness: 10 nm, 20 nm, and 30 nm

Measurement points: 26 points on the substrate surface

Figure 28:
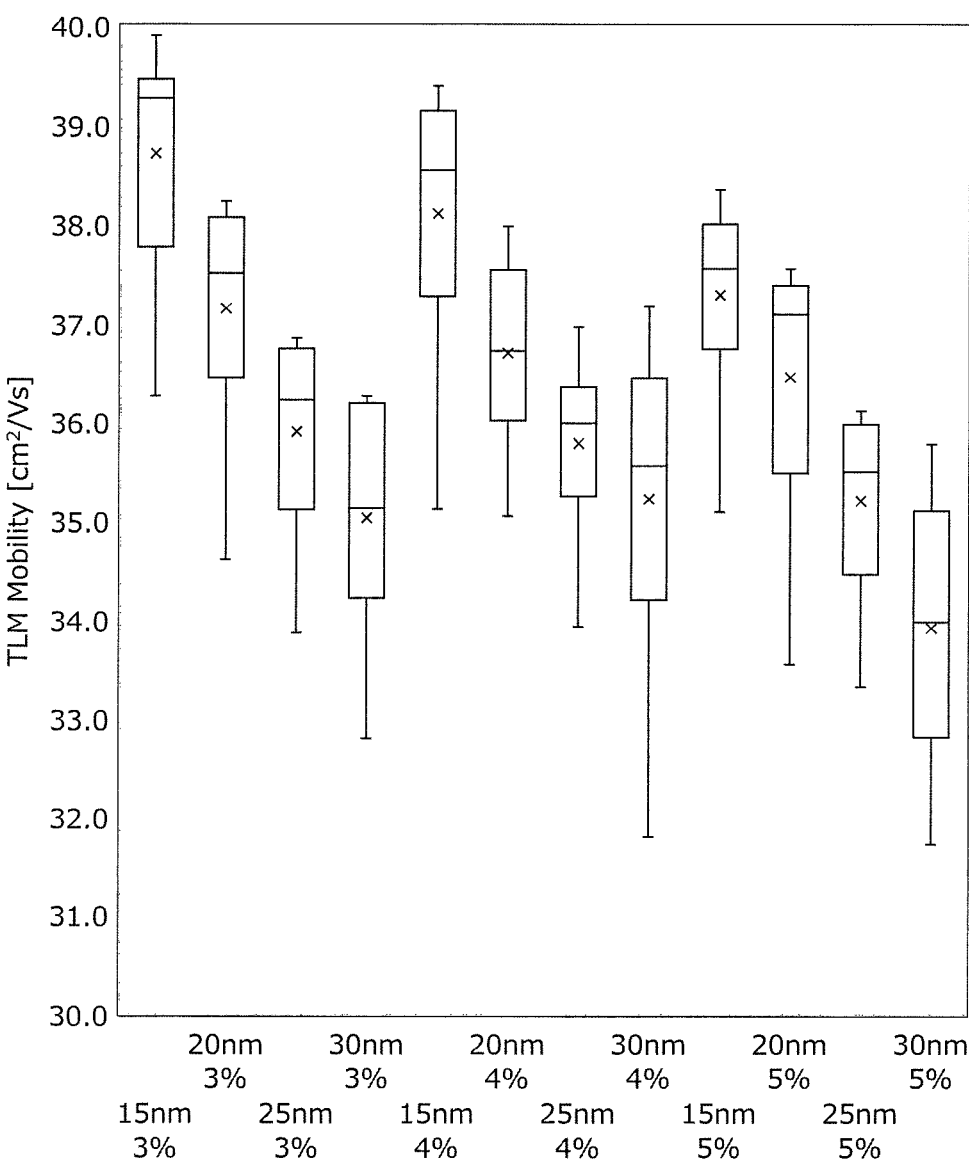
FIG. 28 shows a true mobility for each deposition condition of the oxide semiconductor film.

FIG. 28 shows the true mobility of the oxide semiconductor film for each deposition condition. The horizontal axis is the oxide semiconductor film deposition condition, and the vertical axis is the true mobility.

According to the results in FIG. 28, it was confirmed that the lower the oxygen partial pressure during the deposition of the oxide semiconductor film, the higher the true mobility increases, and the thinner the oxide semiconductor layer thickness, the higher the true mobility of the oxide semiconductor layer. In other words, it was confirmed that the lower the oxygen partial pressure and the thinner the oxide semiconductor layer thickness during the deposition of the oxide semiconductor film, the higher the true mobility of the oxide semiconductor layer.

Next, the results of reliability tests of the semiconductor devices manufactured in the present example are described. In PBTS, a positive voltage is applied to the gate electrode of the semiconductor device, and the amount of change in the threshold voltage before and after the voltage is applied is evaluated. NBTIS is to apply a negative voltage to the gate electrode of a semiconductor device and evaluate the amount of threshold voltage fluctuation before and after the voltage is applied.

Figure 29:
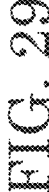
FIG. 29 shows the amount of variation of threshold voltage ΔVth for each deposition condition of the oxide semiconductor film.

FIG. 29 shows the amount of variation of the threshold voltage ΔVth for each deposition condition of the oxide semiconductor film. The horizontal axis is the deposition condition of the oxide semiconductor film, and the vertical axis is the amount of variation of the threshold voltage.

According to the results in FIG. 29, it was confirmed that the lower the oxygen partial pressure during the deposition of the oxide semiconductor film, the smaller the amount of fluctuation in the threshold voltage, and the thinner the oxide semiconductor layer thickness, the smaller the amount of fluctuation in the threshold voltage. In other words, it was confirmed that the reliability of semiconductor devices improves as the oxygen partial pressure during the deposition of the oxide semiconductor film is low and the thickness of the oxide semiconductor layer is thin.

Each of the embodiments and modifications described above as an embodiment and modifications of the present invention can be appropriately combined and implemented as long as no contradiction is caused. Furthermore, the addition, deletion, or design change of components, or the addition, deletion, or condition change of process as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A method for manufacturing a semiconductor device, the method comprising steps of:

depositing a first metal oxide film with aluminum as a major component on a substrate;

depositing an amorphous oxide semiconductor film on the first metal oxide film under an oxygen partial pressure of 3% to 5%;

processing the oxide semiconductor film into a patterned oxide semiconductor layer;

crystallizing the oxide semiconductor layer by performing a first heat treatment on the patterned oxide semiconductor layer;

processing the first metal oxide film using the crystallized oxide semiconductor layer as a mask;

depositing a gate insulating film on the oxide semiconductor layer; and forming a gate electrode on the gate insulating film, wherein a thickness of the oxide semiconductor film is more than 10 nm and 30 nm or less.

2. The method according to claim 1, wherein the oxide semiconductor film deposition temperature is 100° C. or less.

3. The method according to claim 2, wherein the first heat treatment temperature is 300° C. or more and 500° C. less or less.

4. The method according to claim 1, wherein the thickness of the first metal oxide film is 1 nm or more and 50 nm or less.

5. The method according to claim 1, wherein a second metal oxide film with aluminum as the main component is deposited, after the gate insulating film is deposited, followed by a second heat treatment.

6. The method according to claim 1, wherein the oxide conductive layer has a polycrystalline structure.

* * * * *